United States Patent
Madasu

(10) Patent No.: US 11,560,776 B2
(45) Date of Patent: Jan. 24, 2023

(54) METHODS AND SYSTEMS OF MODELING FLUID DIVERSION TREATMENT OPERATIONS

(71) Applicant: Halliburton Energy Services, Inc., Houston, TX (US)

(72) Inventor: Srinath Madasu, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 993 days.

(21) Appl. No.: 16/314,796

(22) PCT Filed: Aug. 16, 2016

(86) PCT No.: PCT/US2016/047147
§ 371 (c)(1),
(2) Date: Jan. 2, 2019

(87) PCT Pub. No.: WO2018/034652
PCT Pub. Date: Feb. 22, 2018

(65) Prior Publication Data
US 2019/0309604 A1    Oct. 10, 2019

(51) Int. Cl.
*E21B 43/27*    (2006.01)
*C09K 8/76*    (2006.01)
(Continued)

(52) U.S. Cl.
CPC .......... *E21B 41/0092* (2013.01); *E21B 41/00* (2013.01); *E21B 43/14* (2013.01);
(Continued)

(58) Field of Classification Search
CPC ...... E21B 49/00; E21B 2200/20; E21B 43/28; E21B 43/27; C09K 8/62; C09K 8/66;
(Continued)

(56) References Cited

U.S. PATENT DOCUMENTS

| | | | |
|---|---|---|---|
| 7,114,567 B2* | 10/2006 | Chan | C09K 8/72 507/237 |
| 9,085,975 B2* | 7/2015 | Abad | E21B 43/26 |

(Continued)

FOREIGN PATENT DOCUMENTS

| | | |
|---|---|---|
| WO | 2008/001310 A1 | 1/2008 |
| WO | 2016/126252 A1 | 8/2016 |
| WO | 2017/099808 A2 | 6/2017 |

OTHER PUBLICATIONS

Gu, H., et al. "Effect of Fracture Breakdown Pressure on Multicluster Hydraulic Fracturing Treatments." 49th US Rock Mechanics/Geomechanics Symposium. American Rock Mechanics Association, 2015.

(Continued)

*Primary Examiner* — Kenneth L Thompson
(74) *Attorney, Agent, or Firm* — Delizio, Peacock, Lewin & Guerra

(57) ABSTRACT

Methods and system for modeling wellbore treatment operations in which the flow of treatment fluids may be diverted are provided. In one embodiment, the methods comprise: receiving, at a processing component, one or more treatment operation inputs characterizing a treatment operation for a wellbore system comprising a wellbore penetrating at least a portion of a subterranean formation and a treatment fluid comprising a diverter, wherein at least one of the one or more treatment operation inputs comprises the inlet concentration of the diverter in the treatment fluid; and using the processing component to determine a wellbore system pressure distribution and a wellbore system flow distribution based, at least in part, on the one or more treatment operation inputs and a diversion flow model, wherein the diversion flow model captures an effect of the diverter on fluid flow in the wellbore system.

20 Claims, 17 Drawing Sheets

(51) Int. Cl.
    *C09K 8/74*     (2006.01)
    *E21B 41/00*     (2006.01)
    *E21B 43/14*     (2006.01)
    *E21B 43/16*     (2006.01)
    *E21B 47/06*     (2012.01)
    *G06F 30/23*     (2020.01)
    *G06F 30/28*     (2020.01)
    *E21B 21/00*     (2006.01)
    *E21B 43/26*     (2006.01)
    *G01V 99/00*     (2009.01)

(52) U.S. Cl.
    CPC ............ *E21B 43/16* (2013.01); *E21B 43/162* (2013.01); *E21B 47/06* (2013.01); *G06F 30/23* (2020.01); *G06F 30/28* (2020.01); *E21B 21/003* (2013.01); *E21B 43/26* (2013.01); *G01V 99/005* (2013.01)

(58) Field of Classification Search
    CPC . C09K 8/72; C09K 8/725; C09K 8/74; C09K 8/76; G01V 99/005
    See application file for complete search history.

(56) References Cited

U.S. PATENT DOCUMENTS

| | | | |
|---|---|---|---|
| 9,135,475 | B2 | 9/2015 | Lecerf et al. |
| 10,087,722 | B2* | 10/2018 | Lecerf .................. E21B 43/26 |
| 10,240,436 | B2* | 3/2019 | Lecerf .................. E21B 33/138 |
| 10,422,207 | B2* | 9/2019 | Aidagulov ............. E21B 43/26 |
| 10,494,921 | B2* | 12/2019 | Weng .................... E21B 49/008 |
| 10,597,982 | B2* | 3/2020 | Shahri .................. E21B 43/26 |
| 10,619,469 | B2* | 4/2020 | Han ....................... E21B 41/00 |
| 11,105,187 | B2* | 8/2021 | Mogensen ............. G05B 17/02 |
| 11,131,177 | B2* | 9/2021 | Lo Cascio ............. C09K 8/72 |
| 2012/0285692 | A1 | 11/2012 | Potapenko et al. |
| 2014/0076544 | A1 | 3/2014 | Lecerf et al. |
| 2014/0182841 | A1 | 7/2014 | Lecerf et al. |
| 2015/0075779 | A1 | 3/2015 | Walters et al. |
| 2016/0024914 | A1* | 1/2016 | Ghommem ............ E21B 49/00 166/254.2 |
| 2016/0047207 | A1 | 2/2016 | Lecerf et al. |
| 2018/0308034 | A1 | 10/2018 | Madasu et al. |

OTHER PUBLICATIONS

Hill, A. Daniel, and W. R. Rossen. "Fluid placement and diversion in matrix acidizing." University of Tulsa Centennial Petroleum Engineering Symposium (SPE 27982). Society of Petroleum Engineers, 1994.

Li, Zhaomin, et al. "Research and application of mathematical model for foam diversion acidizing." SPE Western Regional and Pacific Section AAPG Joint Meeting (SPE 114003). Society of Petroleum Engineers, 2008.

International Search Report and Written Opinion issued in related PCT Application No. PCT/US2016/047147 dated May 16, 2017, 16 pages.

Al-Ibadi, Adnan, and Faruk Civan. "Evaluation of Near-Wellbore Formation Treatment by Gel Particles Using Dimensional Analysis." SPE Production and Operations Symposium (SPE 164507). Society of Petroleum Engineers, 2013.

Al-Ibadi, Adnan, and Faruk Civan. "Experimental study of gel particles transport through porous media." SPE Latin America and Caribbean Petroleum Engineering Conference (SPE 153557). Society of Petroleum Engineers, 2012.

Wojtanowicz, A. K., Z. Krilov, and J. P. Langlinais. "Study on the effect of pore blocking mechanisms on formation damage." SPE Production Operations Symposium (SPE 16233). Society of Petroleum Engineers, 1987.

Sato, Toru, et al. "Microscale numerical simulation of the permeability reduction due to trapping of suspended fine particles within sand sediments." Transport in porous media 96.1 (2013): 153-167.

* cited by examiner

METHODS AND SYSTEMS OF MODELING FLUID DIVERSION TREATMENT OPERATIONS

CROSS-REFERENCE TO RELATED APPLICATION

The present application is a U.S. National Stage Application of International Application No. PCT/US2016/047147 filed Aug. 16, 2016, which is incorporated herein by reference in its entirety for all purposes.

BACKGROUND

The present disclosure relates generally to wellbore and reservoir simulations and, more particularly, to methods and systems for modeling fluid diversion in a wellbore and the surrounding formation.

Treatment fluids can be used in a variety of subterranean treatment operations. As used herein, the terms "treat," "treatment," "treating," and grammatical equivalents thereof refer to any subterranean operation that uses a fluid in conjunction with achieving a desired function and/or for a desired purpose. Use of these terms does not imply any particular action by the treatment fluid. Illustrative treatment operations can include, for example, fracturing operations, gravel packing operations, acidizing operations, scale dissolution and removal, consolidation operations, and the like. In some embodiments, treatment operations may comprise treatment fluids comprising a diverter.

For example, after a wellbore is drilled in a subterranean producing zone, it is typical to introduce a treatment fluid into the zone. For example, a producing zone can be stimulated by introducing an aqueous acid solution into the matrix of a producing zone to dissolve formation material or materials near the wellbore which impede well productivity, and thereby increase its porosity and permeability. This results in an increase in the production of hydrocarbons therefrom. To ensure that the producing zone is contacted by the treating fluid uniformly, a diverting agent may be placed in the zone to direct the placement of a desired treatment fluid. One technique is to pack the diverting agent in perforation tunnels extending from the wellbore into the subterranean zone. The diverting agent in the perforation tunnels causes the treating fluid introduced therein to be uniformly distributed between all of the perforations whereby the subterranean zone is uniformly treated. The term "zone," as used herein, simply refers to a portion of the formation and does not imply a particular geological strata or composition.

Another example of a subterranean treatment that often uses an aqueous treatment fluid is hydraulic fracturing. In a hydraulic fracturing treatment, a viscous fracturing fluid is introduced into the formation at a high enough rate to exert sufficient pressure on the formation to create and/or extend fractures therein. The viscous fracturing fluid suspends proppant particles that are to be placed in the fractures to prevent the fractures from fully closing when hydraulic pressure is released, thereby forming conductive channels within the formation through which hydrocarbons can flow toward the wellbore for production. In certain circumstances, variations in the subterranean formation will cause the fracturing fluid to create and/or extend fractures non-uniformly. Typically, one or more dominant fractures may extend more rapidly than non-dominant fractures. These dominant fractures utilize significantly more fracturing fluid than non-dominant fractures, thereby reducing pressure on non-dominant fractures and slowing or stopping their extension. Dominant fractures can be identified using fiber optics to measure fluid flow rates to each fracture and/or using micro-seismic sensors to detect the growth rate of the fractures. Operators have addressed the unbalanced distribution of fracture fluid by introducing a certain quantity of diverters into the fracturing fluid when dominant fractures are identified. The diverters travel to the dominant fractures and restrict the flow of fracturing fluid to the dominant fractures or plug the dominant fractures. In some applications, these diverters are composed of degradable materials, including water-hydrolysable materials such as polylactic acid, which degrade over time and restore permeability to plugged or restricted fractures.

Fluid flow models can be used to analyze and/or predict fluid flow, for example, in a wellbore system environment (e.g., in a wellbore, a fracture network, within the reservoir rock matrix, in a well system tool, etc.) or other environments. In some environments, the fluid flow is unsteady and multi-dimensional (e.g., three-dimensional or at least two-dimensional). For example, in some types of fractures, the dominant flow is two-dimensional, and includes transient behaviors. In some instances, two- or three-dimensional flow can be described by a one-dimensional flow model, for example, by integrating the governing flow equations over the cross-section of the two- or three-dimensional flow path. In some cases, the resulting equations include nonlinear partial differential equations that can be solved using finite difference, finite volume, or finite element methods. In some cases, the use of one-dimensional flow models can reduce computational costs, and allow for faster or more computationally efficient simulations. In some instances, a flow model can be used to perform numerical simulations in real time, for example, during a fracture treatment or during another well system activity.

In some applications, models are too complex to perform real-time analysis of a treatment operation. Additionally, many models do not account for the effects of a diverter on fluid flow and permeability.

BRIEF DESCRIPTION OF THE DRAWINGS

These drawings illustrate certain aspects of some of the embodiments of the present disclosure, and should not be used to limit or define the claims.

DESCRIPTION OF CERTAIN EMBODIMENTS

Figure 1:
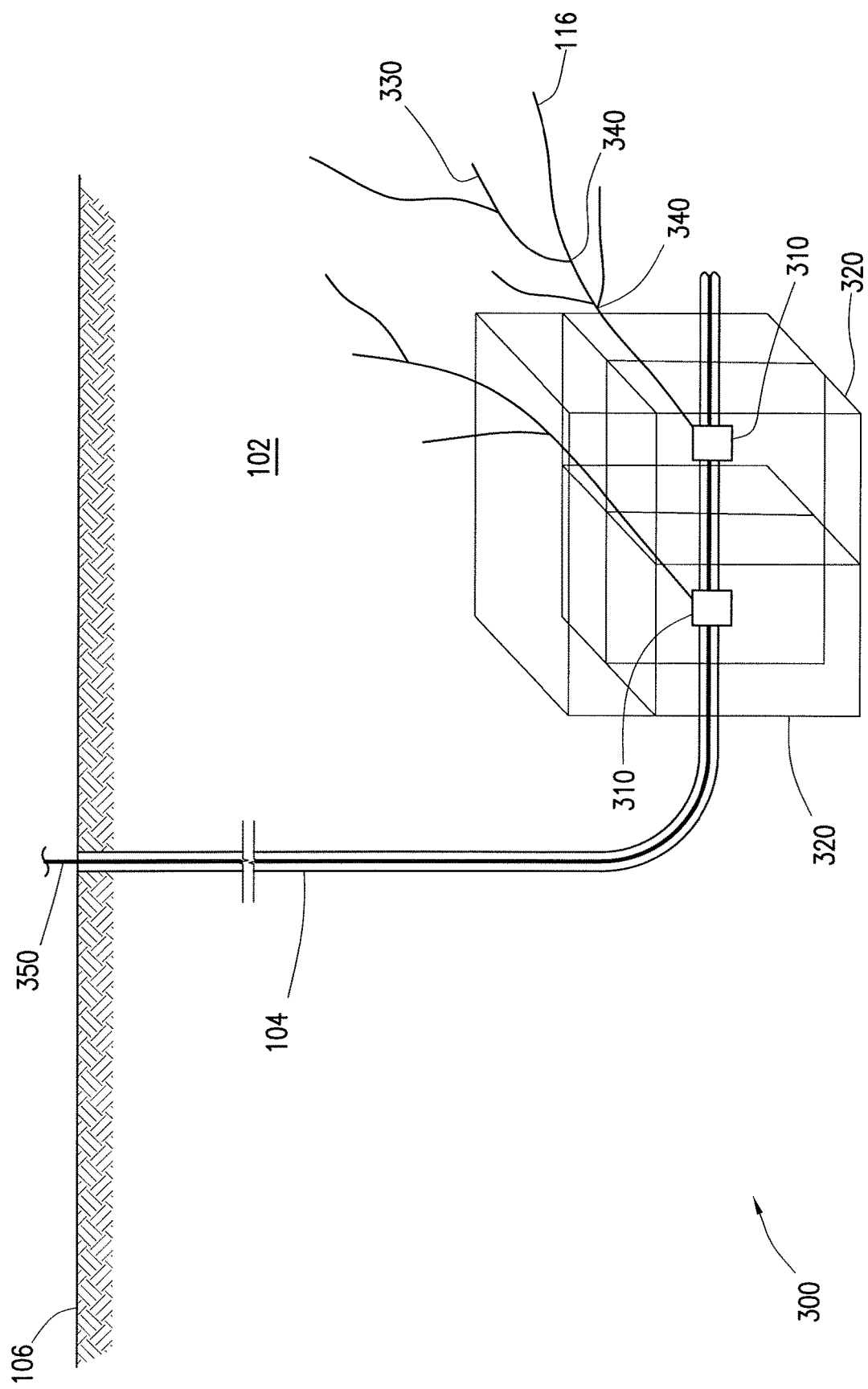
FIG. 1 is a diagram of a computational representation of certain aspects of a wellbore system and the underlying formation geometry according to certain embodiments of the present disclosure.

Illustrative embodiments of the present disclosure are described in detail herein. In the interest of clarity, not all features of an actual implementation may be described in this specification. It will of course be appreciated that in the development of any such actual embodiment, numerous implementation specific decisions may be made to achieve the specific implementation goals, which may vary from one implementation to another. Moreover, it will be appreciated that such a development effort might be complex and time consuming, but would nevertheless be a routine undertaking for those of ordinary skill in the art having the benefit of the present disclosure.

The present disclosure relates to methods and systems for modeling wellbore treatment operations. More particularly, the present disclosure relates to methods and systems for modeling wellbore treatment operations in which the flow of treatment fluids may be diverted.

In certain embodiments, the present disclosure may provide a method comprising: receiving, at a processing component, one or more wellbore treatment inputs characterizing a treatment operation for a wellbore penetrating at least a portion of a subterranean formation, wherein the treatment operation comprises a treatment fluid comprising a diverter; receiving, at the processing component, one or more formation inputs characterizing the subterranean formation; using the processing component to determine a wellbore pressure distribution based, at least in part, on the one or more wellbore treatment inputs and a wellbore model, wherein the wellbore model comprises: a fluid flow model, a diverter transport model, and a junction model; and using the processing component to determine a formation stress field for the subterranean formation, based, at least in part, on the one or more formation inputs, the wellbore pressure distribution, and a geomechanical model of the subterranean formation.

In certain embodiments, the present disclosure may also comprise a method comprising: receiving, at a processing component, one or more treatment operation inputs characterizing a treatment operation for a wellbore system comprising a wellbore penetrating at least a portion of a subterranean formation and a treatment fluid comprising a diverter, wherein at least one of the one or more treatment operation inputs comprises the inlet concentration of the diverter in the treatment fluid; and using the processing component to determine a wellbore system pressure distribution and a wellbore system flow distribution based, at least in part, on the one or more treatment operation inputs and a diversion flow model, wherein the diversion flow model captures an effect of the diverter on fluid flow in the wellbore system.

In certain embodiments, the present disclosure may also comprise a method comprising: selecting a diverter and a bridging agent for use in an acidizing operation for a wellbore system; using the processing component to generate a permeability reduction model for the diverter and the bridging agent; using the processing component to generate an acidizing diversion model for the wellbore system comprising the diverter and the bridging agent, wherein the acidizing diversion model comprises the permeability reduction model; receiving, at the processing component, one or more parameters related to the acidizing operation; and using the processing component to simulate the acidizing operation based, at least in part, on applying the acidizing diversion model to the one or more parameters related to the acidizing operation.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing components such as a central processing unit (CPU), microprocessor, or hardware or software programmable control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

As used herein, "skin" is a dimensionless factor calculated to determine the production efficiency of a well by comparing actual conditions with theoretical or ideal conditions. A positive skin value indicates some damage or influences that are impairing well productivity. A negative skin value indicates enhanced productivity, typically resulting from stimulation.

In some embodiments, the methods and systems of the present disclosure may comprise an integrated diversion model. In certain embodiments, an integrated diversion model may be considered a real-time model in which, in some embodiments, an integrated diversion model may be used in or near real-time to evaluate an ongoing treatment operation. In some embodiments, a treatment operations may comprise treatment fluids comprising a diverter. An integrated diversion model may be used, for example, to determine a formation stress field for a subterranean formation. In some embodiments, an integrated diversion model may be used to determine a formation stress field for a subterranean formation based, at least in part, on data obtained in or near real-time (which may be referred to as "real-time measurements").

In some embodiments, the integrated diversion model may comprise a fully-integrated coupled model of fluid-solid mechanics. For example, in certain embodiments, an integrated diversion model may comprise one or more models, including, but not limited to, a geomechanical model, a fluid flow model, a diverter transport model, a junction model, an energy model, any other suitable model, or any combination thereof. In some embodiments, the integrated diversion model may comprise a wellbore model comprising one or more models, including, but not limited to a fluid flow model, a diverter transport model, a junction model, and any combination thereof. In certain embodiments, the one or more models may be coupled together. Coupling the models together to form an integrated diversion model may, in certain embodiments, allow the integrated diversion model to be more computationally efficient than a similar uncoupled model. For example, in certain embodiments, the integrated diversion model may be sufficiently efficient to assess various aspects of a treatment operation in real time, including, but not limited to diversion effectiveness and the amount of diverter to pump into the wellbore.

The integrated diversion model may be used to simulate diversion for hydraulic fracturing, matrix acidizing, and other suitable diversion applications. The integrated diversion model may be incorporated into existing simulation software or developed as a stand alone diversion simulation. In some embodiments of the model, it may be assumed that diversion depends mainly on the in-situ stress and friction in the wellbore.

In certain embodiments, the integrated diversion model may comprise an appropriate mathematical description of dynamic, fully coupled fluid-solid mechanics, applied to diversion in a wellbore and the formation around it in fractured reservoirs.

Among the many potential advantages to the methods and systems of the present disclosure, only some of which are alluded to herein, the integrated diversion model of the present disclosure may provide more accurate and up-to-date data on diverter performance and positioning than certain traditional models. In some embodiments, the integrated diversion model may be sufficiently computationally efficient to calculate in or near real-time data during treatment operations. Furthermore, unlike traditional models, the integrated diversion model may combine all the necessary models for the diversion process.

FIG. 1 depicts a computational representation of certain aspects of underlying formation geometry according to certain embodiments of the present disclosure. The simplified wellbore system 300 depicted in FIG. 1 comprises a wellbore 104 penetrating at least a portion of a subterranean formation 102. The wellbore comprises one or more injection points 310 where one or more fluids may be injected from the wellbore 104 into the subterranean formation 102. In some embodiments, the wellbore pressure at these injection points 310 may be a wellbore treatment input for an integrated diversion model. The subterranean formation 102 comprises pores initially saturated with reservoir fluids (e.g., oil, gas, and/or water). Initially, the computational blocks 320 are at a structural equilibrium, and the fluids in the porous formation 102 are at rest. In certain embodiments, a formation stress field may be determined using a geomechanical model based, at least in part, on computational blocks 320 representing the formation.

In certain embodiments, the wellbore system 300 may be stimulated by the injection of a fracturing fluid at one or more injection points 310 in the wellbore 104. In certain embodiments, the one or more injection points 310 may correspond to perforation points 310 in a casing of the wellbore 104. When fluid enters the formation 102 at the injection points 310, one or more fractures 116 are opened, and the pressure difference between the solid stress and the fracture 116 causes flow into the fracture 116. In certain embodiments, a diverting agent may enter the injection point 310 and restrict the flow of further fluid. In some embodiments, the fracturing fluid may comprise a diverter. Flow restriction caused by the diverter may increase the surface pressure.

The subterranean formation 102 may comprise any subterranean geological formation suitable for fracturing (e.g., shale) or acidizing (e.g., carbonate), or any other type of treatment operation. As depicted in FIG. 1, the formation 102 comprises at least one fracture network 330 connected to the wellbore 104. The fracture network 330 may comprise a plurality of junctions 340 and a plurality of fractures 116.

The fracture network 330 shown in FIG. 1 contains a relatively low number of junctions 340 and fractures 116. A person of ordinary skill in the art would appreciate that a fracture network may comprise of a wide range of junctions 340 and fractures 116. The number of junctions 340 and fractures 116 may vary drastically and/or unpredictably depending on the specific characteristics of the formation 102. For example, the fracture network 330 may comprise on the order of thousands of fractures 116 to tens of thousands of fractures 116.

In certain embodiments, inputs to the integrated diversion model may comprise one or more wellbore treatment inputs and/or one or more formation inputs. In certain embodiments, the one or more wellbore treatment inputs may characterize a treatment operation for a wellbore 104 penetrating at least a portion of a subterranean formation 102. For example, in certain embodiments, the one or more wellbore treatment inputs may include, but are not limited to an amount of diverter pumped into the wellbore system 300, the wellbore pressure at the injection points 310, the flow rate at the wellbore inlet 350, the pressure at the wellbore inlet 350, a wellbore depth, a wellbore diameter, a number of perforation clusters in a casing, a perforation cluster length, a perforation diameter, a distance between perforation clusters, a diverter particle diameter, and any combination thereof and any combination thereof. In certain embodiments, the one or more wellbore treatment inputs may comprise real-time measurements. In some embodiments, real-time measurements comprise at least one of pressure measurements and flow rate measurements. In certain embodiments, real-time measurements may be obtained from one or more wellsite data sources. Wellsite data sources may include, but are not limited to flow sensors, pressure sensors, thermocouples, and any other suitable measurement apparatus. In certain embodiments, wellsite data sources may be positioned at the surface, on a downhole tool, in the wellbore 104 or in a fracture 116. Pressure measurements may, for example, be obtained from a pressure sensor at a surface of the wellbore 104.

In certain embodiments, the formation stress field determined by an integrated diversion model may be used, at least in part, to determine whether to use a diverter, to determine how much diverter to use, to develop a diverter pumping schedule, or any combination thereof. For example, in certain embodiments, flow rates and/or pressure sensors may be positioned at the inlet 350 of the wellbore 104 to measure the flow rate and pressure in real time. The measured inlet flow rate and pressure data may be used as wellbore treatment inputs. In some embodiments, the one or more formation inputs may characterize the subterranean formation 102. In certain embodiments, the one or more formation inputs may include one or more properties of the subterranean formation 102, including, but not limited to the geometry of the subterranean formation 102, the natural stress field, pore pressure, formation temperature, and any combination thereof. In some embodiments, an earth model may provide one or more formation inputs.

Figure 2:
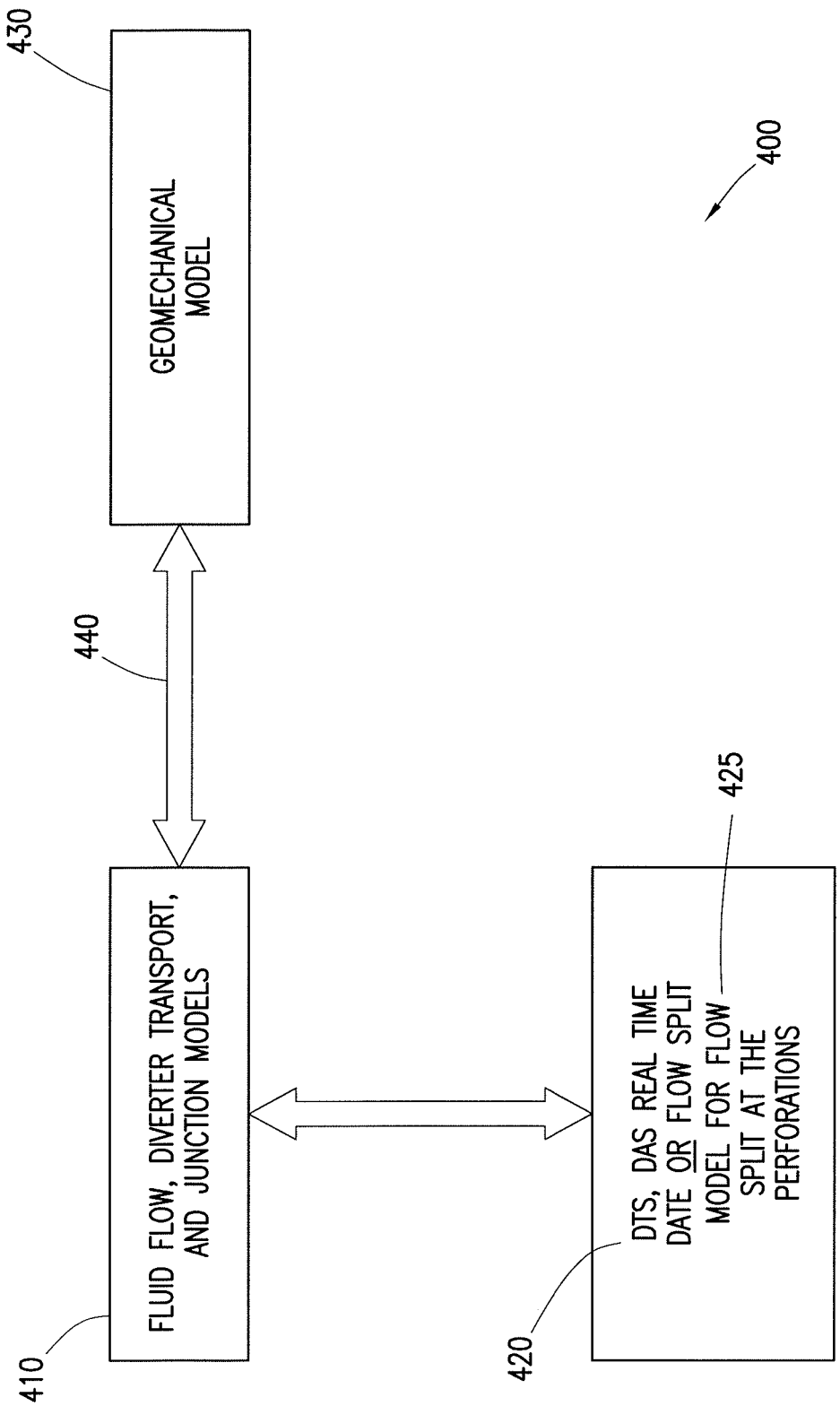
FIG. 2 is a schematic representation of an example integrated diversion model according to certain embodiments of the present disclosure.

As shown in FIG. 2, the integrated diversion model 400 may comprise a wellbore model 410 comprising a fluid flow model, diverter transport model, and junction model. The wellbore model 410 may be coupled 440 to a geomechanical model of the subterranean formation 430. In some embodiments, the integrated diversion model 400 may determine the flow split at the perforation points 310 by at least one of real time data of the flow split 420 or a fluid flow model for the flow split 425.

In certain embodiments, the fluid flow model may comprise a mathematical fluid flow model suitable for modeling flow in a wellbore system. In certain embodiments, the fluid flow model may comprise a one-dimensional fluid flow model. Although a one-dimensional fluid flow model is described in the present disclosure, a person of ordinary skill in the art will appreciate that other flow models may be used in the integrated diversion model. In certain embodiments, the one-dimensional flow equations for the fluid flow model may be derived from the Navier-Stokes equations. In some embodiments, the fluid flow model may comprise a one-dimensional model for flow in a wellbore with known inlet flow rates and pressure. For example, a one-dimensional model for flow in a wellbore with known inlet flow rates and pressure may be modeled as the following:

$$p_x - \rho g + f = 0 \quad (1)$$

$$Q - Q_L = 0 \quad (2)$$

where p represents the pressure along the wellbore, x is the wellbore alignment direction, ρ is the fluid-proppant mixture density, g is gravitational acceleration, f is the friction force, Q is the wellbore flow rate, and $Q_L$ is the leak-off flow rate into the formation through the perforations. The subscript x indicates the derivative with respect to x. In certain embodiments, the unknown variables in the fluid flow model may be pressure p (other than the inlet pressure) and wellbore flow rate Q.

In some embodiments, the system of equations comprising equations (1) and (2) may be solved using appropriate boundary conditions. Examples of boundary conditions suitable for some embodiments of the present disclosure include, but are not limited to, the flow-rate at the wellbore inlet, the pressure at the wellbore inlet, no flow at the end of the wellbore, the bottom-hole pressure, no flow at the closed end of a fracture, the reservoir pressure, and any combination thereof. In some embodiments, one or more of the boundary conditions may be determined from real-time measurements or data. For example, in certain embodiments, the wellbore inlet flow rate may be measured by a flowmeter at the inlet of the wellbore and/or the pressure at the wellbore inlet may be measured by a pressure sensor.

In some embodiments of the wellbore system 300 shown in FIG. 1, a diverter may be introduced into the wellbore 104 and transported into fractures 116. The diverter may be accounted for in the integrated diversion model 400 shown in FIG. 2 by incorporating a diverter transport model. In some embodiments, the diverter transport model may be selected based, at least in part, on the application (e.g., fracturing, matrix acidizing), the desired degree of physical accuracy, the desired computational efficiency, or any combination thereof. In some embodiments, the diverter transport model may comprise the following equation:

$$(\phi Q)_x = 0 \quad (3)$$

where ϕ is the diverter volume fraction, Q is the flow rate, and the x subscript denotes the partial derivative with respect to the wellbore alignment direction. In this embodiment of the diverter transport model, gravitational settling is assumed to be negligible and is ignored, but may be modeled in other embodiments of the present disclosure. The presence of a diverter may influence the fluid properties in equation (2) (e.g., viscosity and density). In certain embodiments, this influence may be computed using correlations or tabulated data from experiments, or may be ignored for a simplified passive diverter transport model. In some embodiments, temperature effects on flow may be ignored, or may be modeled throughout the wellbore using an energy model.

Figure 3A:
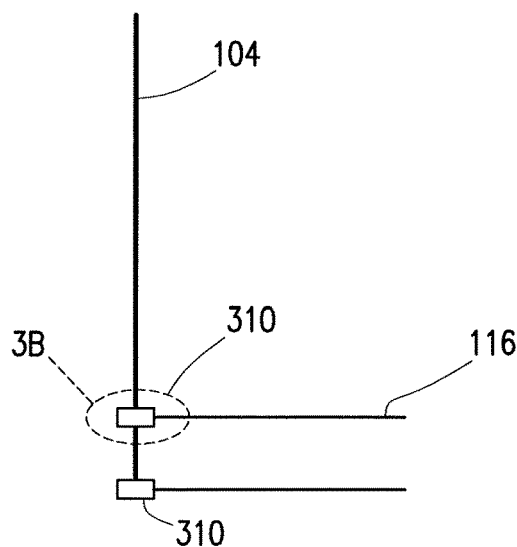
FIGS. 3A and 3B are schematic diagrams of an example junction model according to certain embodiments of the present disclosure.
Figure 3B:
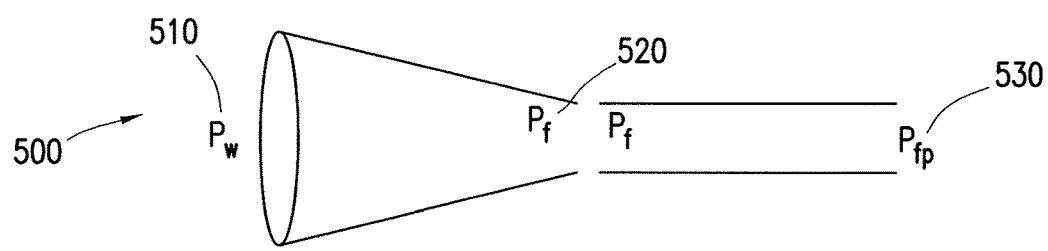

The integrated diversion model 400 shown in FIG. 2 may comprise a junction model to account for one or more junctions 340 in the wellbore system 300 shown in FIG. 1. In some embodiments, the one or more junctions may include, but are not limited to, perforation points 310, junctions between one or more portions of a multilateral wellbore, natural fractures in an open hole system, fractures created during a fracturing operation, and any other suitable downhole junction. FIGS. 3A and 3B show a schematic of a junction model according to certain embodiments of the present disclosure. As shown in FIG. 3A, a wellbore 104 may comprise one or more perforation points 310 which allow flow between the wellbore 104 and one or more fractures 116. As shown in FIG. 3B, the perforation points 310 of FIG. 3A may be modeled using a junction model 500 based, at least in part, on the wellbore pressure 510, fracture pressure 520, and the fracture propagation pressure 530.

Various fluid continuity conditions may be imposed at the junctions 310, depending, at least in part, on the type and spatial dimension of the flow equations used to model each junction 310. In certain embodiments, the flow split among junctions 310 may be obtained from real-time data acquired by Distributed Temperature Sensing (DTS) data or Distributed Acoustic Sensing (DAS). In some embodiments, a flow split model may be used to determine the flow splits based, at least in part, on the wellbore pressure.

For example, in an embodiment of a wellbore system 300 comprising a diverter, junction conditions may be modeled based on the ratio of the flow rate as the following:

$$M_j = \frac{Q_j}{Q_{Total}} M_{Total} \tag{4}$$

where $M_j$ is the fraction of the diverter in each section of interest, $M_{Total}$ is the total mass of the diverter, $Q_j$ is the flow rate in each section of interest, and $Q_{Total}$ is the total flow rate for the system. For example, in certain embodiments, equation (4) may be used to determine the amount of diverter in each fracture. The flow rate $Q_j$ may be given by the Kozeny-Carman equation for the flow through particles:

$$Q_j = \frac{kA_{perf}}{\nu L_{perf}} (p_w - p_f) \tag{5}$$

where $p_f$ is the fracture pressure, $p_w$ is the wellbore pressure, $A_{perf}$ is the area of the perforation, $L_{perf}$ is the length of the perforation, $\nu$ is Poisson's ratio and k is permeability. The permeability k in equation (5) may be determined according to the Kozeny-Carman permeability equation, based on the porosity as follows:

$$k = \frac{\varphi^2 D_p^2 \phi^3}{180(1-\phi)^3} \tag{6}$$

$$\phi = \frac{V_{perforation} - M_j \rho_{particles}}{V_{perforation}} \tag{7}$$

where $\phi$ is porosity, $D_p$ is the particle diameter, $\varphi$ is the particle sphericity, $V_{perforation}$ is the volume of the perforation, and $\rho_{particles}$ is the particle density.

In certain embodiments, fracture pressure may be assumed to be constant along the fracture, in which case the fracture propagation pressure $p_{fp}$, is equal to the fracture pressure $p_f$. The fracture propagation pressure and the volume of the fracture may be given as follows:

$$p_{fp} = \sigma_h + \frac{K_{IC}}{\sqrt{\pi L_f}} \tag{8}$$

$$V_{fp} = \frac{\sqrt{\pi}(1-\nu^2)hK_{IC}}{2E} L_f^{3/2} \tag{9}$$

where $\sigma_h$ is the horizontal minimum principle stress, $K_{IC}$ is the critical stress intensity factor, h is fracture height, $L_f$ is the fracture half-length, Vfp is the fracture volume, $\nu$ is Poisson's ratio, h is the height of the fracture, and E is the Young's modulus. Assuming that $p_{fp} = p_f$ at time t the fluid volume may be balanced as follows:

$$\frac{kA_{perf}}{\nu L_{perf}} \left( p_w - \sigma_h - \frac{K_{IC}}{\sqrt{\pi L_f}} \right) t = \frac{\sqrt{\pi}(1-\nu^2)hK_{IC}}{2E} L_f^{3/2} \tag{10}$$

In certain embodiments, equation (10) may be solved for the fracture lengths ($L_f$) to determine the flow rates at the junctions 310 and the wellbore flow distribution for the wellbore system 300 in FIG. 1. In certain embodiments, the wellbore flow distribution is determined based, at least in part, on the one or more wellbore treatment inputs and the wellbore model. Equation (10) may be solved using any suitable numerical method (e.g., the Newton-Raphson method).

In certain embodiments, a wellbore pressure distribution may be determined from equation (1) and the wellbore flow distribution to give the boundary conditions needed to compute the in-situ stress field for the geomechanical model. In certain embodiments, the wellbore pressure distribution is determined based, at least in part, on a wellbore flow distribution. The flow rates in the perforation clusters may be computed from the fracture pressure and wellbore pressure using the orifice equation before the diverter lands:

$$Q_j^2 = \frac{C_D N_{Perf}^2 D_{Perf}^4}{1.975 \rho_f} (p_w - p_f) \tag{11}$$

where $C_D$ is the orifice discharge coefficient, $N_{Perf}$ is the number of perforations in a cluster, $D_{Perf}$ is the perforation diameter, and $\rho_f$ is the wellbore fluid density. The orifice discharge coefficient ($C_D$) may range from less than 0.5 to approximately 1, depending, at least in part, on the upstream Reynolds' number and the roundness of the edges of the perforation.

The fracture initiation pressure is calculated based on assuming that the length of fracture is twice the wellbore radius:

$$p_{fi} = \sigma_h + \frac{K_{IC}}{\sqrt{\pi L_{fi}}} \tag{12}$$

where $p_{fi}$ is the fracture initiation pressure, and $L_{fi}$ is the initial fracture half-length at which the fracture begins to propagate. In some embodiments, more detailed complex fracture modeling could be performed in real time.

Figure 4:
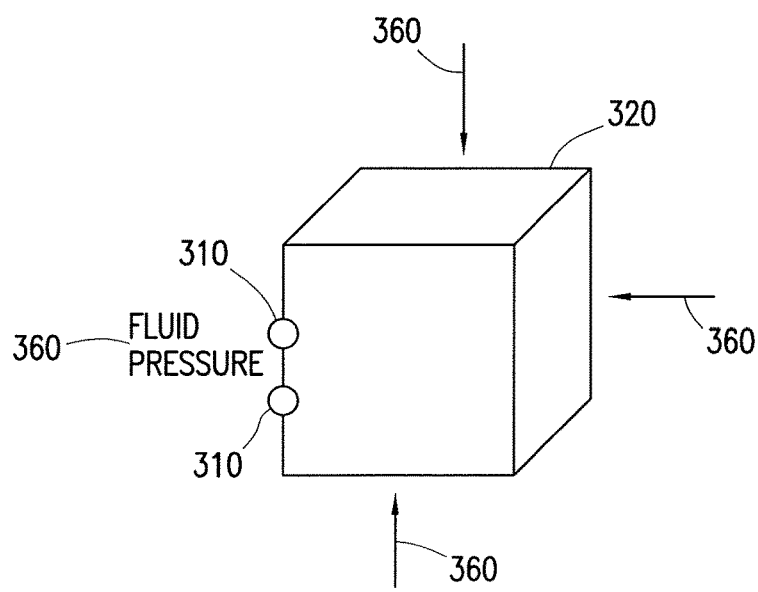
FIG. 4 is a perspective view of a three dimensional cell that may be used as part of a geomechanical model according to certain embodiments of the present disclosure.

In some embodiments, the geomechanical model of the subterranean formation (430 of FIG. 2) may be used to determine the formation stress field for the subterranean formation 102. In certain embodiments, the formation stress field for the subterranean formation 102 may be determined based, at least in part, on the one or more formation inputs, the wellbore pressure distribution, and the geomechanical model. FIG. 4 is a perspective view of a three dimensional cell 320 that may be used as part of a geomechanical model according to certain embodiments of the present disclosure. The cell 320 shown in FIG. 4 is one of several rock blocks 320 which, in certain embodiments, may make up the geomechanical model. The rock blocks 320 of the geomechanical model may be deformed by various forces 360, including, but not limited to pressure forces from the fluid entering the formation acting on the formation boundaries, by pore pressure, tectonic forces, gravitational loading, and any combination thereof. In certain embodiments, the geomechanical model of the subterranean formation may comprise a model for a portion of the subterranean formation. For example, in certain embodiments, the geomechanical model may comprise a model of the portion of the subterranean formation penetrated by the wellbore. A person of skill in the art will appreciate that the geomechanical model may also comprise a model for a different portion of the subterranean formation, a larger portion of the subterranean formation, a smaller portion of the subterranean formation, or any suitable portion of the subterranean formation.

Various mathematical models may be used for the solid mechanics of individual blocks 320. In some embodiments, constraints may be applied to the blocks adjacent to the boundary of the reservoir. The formation deformation under the fluid pressure may be solved using any suitable method, including, but not limited to a Finite Element Method (FEM) and a Boundary Element Method (BEM). A system of quasi-steady equations for the geomechanical model may be formulated for formation dynamics using FEM as the following equation:

$$Kx=F \qquad (13)$$

where K is the stiffness matrix, x is the displacements vector and F is the force vector. In some embodiments, the fluid pressure force may provide a force boundary condition for the formation. In certain embodiments, finite element meshes used for individual rock blocks 320 may be predetermined. In some embodiments, finite element meshes may be optimized based, at least in part, on requirements for accuracy or computational efficiency. For example, in certain embodiments, a geomechanical model may comprise linear elasticity discretized by piecewise linear finite element shape functions on a coarse triangulation of the rock blocks 320. For example, in some embodiments, a finer grid of rock blocks or higher-order displacement shape functions may be used, which may lead to a higher-order piecewise polynomial model.

The equilibrium balance of the geomechanical model may comprise other components, including, but not limited to pore pressure, multiphase reservoir fluid flow, temperature, and any combination thereof. However, in certain embodiments, these additional components may add to the computational time, and may limit the ability of the model to be used for real-time applications.

Figure 5:
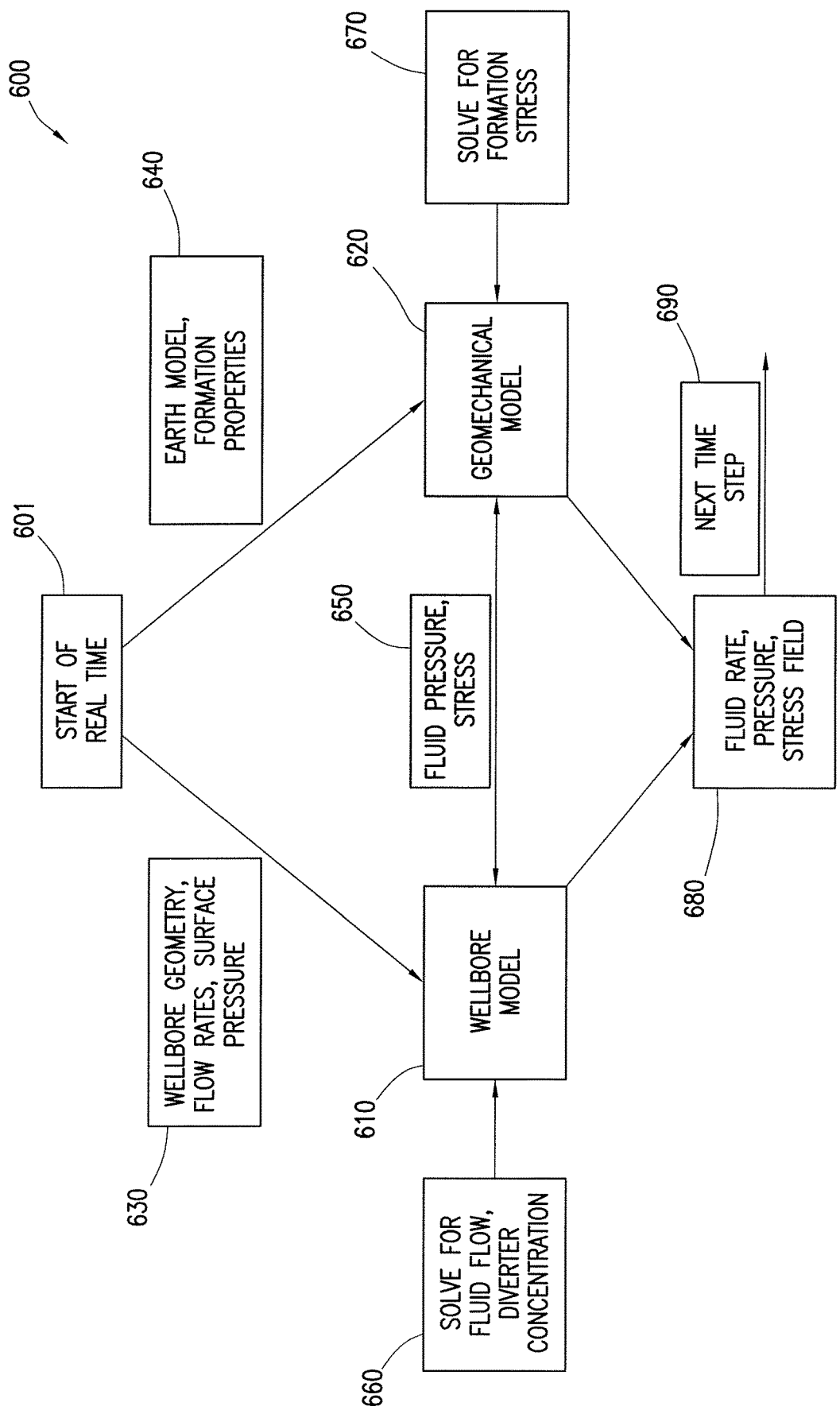
FIG. 5 is a block diagram of a workflow of an integrated diversion model according to certain embodiments of the present disclosure.

FIG. 5 is a block diagram of a workflow of the integrated diversion model 600 according to certain embodiments of the present disclosure. For each time increment, the integrated diversion model may be used to calculate one or more outputs 680, which may include, but are not limited to the wellbore flow distribution, wellbore pressure distribution, the formation stress field, any other parameter related to the wellbore or treatment operation, and any combination thereof. In certain embodiments, the integrated diversion model 600 may be used to calculate one or more outputs 680 for each time increment. For example, the integrated diversion model 600 may be used to calculate the wellbore flow rate, wellbore pressure field, and formation stress field periodically, regularly, continuously, or intermittently throughout a treatment operation.

In some embodiments, a treatment operation may be performed based, at least in part, on the formation stress field. In certain embodiments, the treatment operation may be monitored and adjusted based on the monitoring. The monitoring may, in certain embodiments, comprise determining the formation stress field at one or more time steps during the treatment operation.

In the embodiment shown in FIG. 5, the integrated diversion model 600 comprises a wellbore model 610 and a geomechanical model 620. FIG. 5 depicts an integrated diversion model starting at the beginning of real-time 601 (e.g., the beginning of a treatment operation). The wellbore model 610 comprises a flow model, diverter model, and a junction model. In certain embodiments, wellbore model inputs 630 to the wellbore model 610 may include, but are not limited to the wellbore geometry, flow rates, surface pressure, and any combination thereof. In certain embodiments, geomechanical model inputs 640 may include, but are not limited to an earth model, the formation properties, and any combination thereof. In some embodiments, the fluid pressure 650 determined based, at least in part, on the wellbore model 610 may also be used as an input to the geomechanical model 620.

The wellbore model inputs 630 and geomechanical model inputs 640 may be known, measured, calculated, or estimated. For example, in certain embodiments, the formation properties 640 may be measured using downhole sensors and/or logging equipment, and the wellbore flow rates may be calculated for the previous time increment using the integrated model 600. The wellbore model 610 may be used to solve for various values 660, including, but not limited to the fluid flow, fluid pressure, diverter concentration, and any combination thereof. The geomechanical model 620 may be used, for example, to solve for the formation stress 670. One or more of the outputs 680 of the integrated diversion model 600 may be used as inputs for the model 600 at the next time step 690.

In certain embodiments, the present disclosure provides a diversion flow model that may capture the effects of a diverter on flow in a wellbore-fracture system. In certain embodiments, using a diverter in a wellbore system may cause an associated reduction in permeability, among other reasons, due to an increase in skin. In some embodiments, the diversion flow model may couple the diverter permeability reduction with flow and track the concentration of the diverter. The diversion flow model, may be used, for example, to determine the optimal diverter amount to pump into the wellbore for a particular diversion application.

In certain embodiments, the diversion flow model may be used for a variety of applications, including being coupled with other models and computations. In some embodiments, a flow model of the present disclosure may comprise a one-dimensional diversion flow model coupled with traditional fluid flow models. The diversion flow model may be coupled with one or more models, including, but not limited to a wellbore model, a junction model, a fracture model, a geomechanical model, an earth model, an energy model, and any combination thereof. In some embodiments, the diversion flow model may comprise one or more models coupled together with adjustments for the presence of a diverter. For example, in certain embodiments, the diversion flow model may capture at least one of an effect of the diverter on a permeability of the subterranean formation and an effect of the diverter on fluid flow in a wellbore system. A wellbore model suitable for the diversion flow model of the present disclosure may comprise a diverter transport model and a junction model.

Among the many potential advantages to the methods and systems of the present disclosure, only some of which are alluded to herein, the methods of using the diversion flow model of the present disclosure may provide improved accuracy and model results due to the diversion flow model accounting for permeability reduction in the fracture due to the presence of a diverter, tracking diverter concentration, coupling high Reynolds number flows with low Reynolds flows, accounting for flow diversion and providing an implicit solution. In some embodiments, as compared with traditional modeling, the diverter flow model may be more accurate, faster, and/or may capture more of the most important physics of a wellbore system, such as the effects of the presence of a diverter. Using the diversion flow model to design a treatment operation may, in some embodiments, provide a robust, stable, and accurate numerical solution for the duration of a pumping schedule.

In certain embodiments, inputs to the diversion flow model may comprise one or more treatment operation inputs characterizing a treatment operation for a wellbore system. In some embodiments, the wellbore system may comprise a wellbore penetrating at least a portion of a subterranean formation and a treatment fluid comprising a diverter. In certain embodiments, suitable treatment operation inputs may include, but are not limited to an inlet concentration of a diverter in the treatment fluid, a treatment fluid flow rate, a treatment fluid viscosity, a treatment fluid density, the dimensions of the wellbore, completion information, a property of the subterranean formation, and any combination thereof.

In certain embodiments, the diversion flow model may use an empirical model for permeability based on the Kozeny-Carman equation for permeability, equation (6) above. The reduction in permeability due to the diverter may be incorporated into a simulator for flow computations.

In certain embodiments, the diversion flow model may account for the fast flow of the wellbore and the slow flow of the fracture. For example, in certain embodiments, the diversion flow model may couple high Reynolds number flows with low Reynolds number flows. In some embodiments, the diversion flow model may comprise coupling fast flows (e.g., wellbore flows) with slow flows (e.g., fracture flows). The wellbore's high-velocity flow may continuously interact with the reservoir's relative low-velocity (Darcy-like) flow, especially around the perforation regions. Fast flows may be adequately described by the unsteady Navier-Stokes (NS) equations, while slow flows are often modeled using the unsteady Darcy equations. The fluids' miscible displacement model is given by the unsteady convection-diffusion process for fluid interface tracking.

In certain embodiments, the flow in the wellbore may be described by Navier-Stokes equations and the flow in the fracture system may be governed by the Reynolds equation. Connection equations may be used to connect the two domains. In certain embodiments, the fracture is assumed to have a uniform permeability, K, for the purposes of the diversion flow model. Further assumptions of the diversion flow model may include, but are not limited to one-dimensional flow and symmetric flow in the reservoir formation. The fracture network 330 of the wellbore system 300 may be modeled as a uniformly or non-uniformly distributed multilayered formation. In certain embodiments, a perforated wellbore may be modeled as a one-dimensional flow network, in which each fracture 116 is connected with the wellbore 104 at the flow junctions 310.

In certain embodiments, the wellbore system 300 is assumed to be initially filled with water with a density of $\rho$ (kg/m$^3$) and viscosity of $\mu$ (pa·s). Water may be injected into the system from the wellbore head. In certain embodiments, inlet velocity ($u_{inlet}$), wellbore diameter (D), and $\rho u^2_{inlet}$ may be used as characteristic scales for velocity, length and pressure. In certain embodiments, the flow in the wellbore may be described by NS equations, while flow in the reservoir may be governed by Darcy's law equations in a multilayered reservoir. In some embodiments, the diverter concentration field is governed by a modified convection-diffusion equation for both the wellbore and reservoir. In certain embodiments, the relationship between diverter concentration and fluid density and viscosity is calculated or specified. For example, in certain embodiments, these relationships are experimentally determined and included in the diversion flow model, or a user may input these relationships into the model.

The following provides an example set of equations and boundary conditions that may be used in certain embodiments of the present disclosure to describe the fluid flow and the concentration evolution within an open-hole completion system over three geometric domains: wellbore, reservoir, and fluid junction zones. A person of ordinary skill in the art will understand that different equations and boundary conditions may be used to model the same system and/or that additional equations and/or boundary conditions may be incorporated into the model.

In the wellbore domain, the dimensionless fluid mass and momentum conservations for a one-dimensional Cartesian coordinate system may be described as follows:

$$\frac{\partial u}{\partial x} = 0 \tag{14}$$

$$\frac{\partial u}{\partial t} + \frac{\partial u^2}{\partial x} + \frac{\partial p}{\partial x} + \frac{f_f}{\pi}u^2 = \frac{1}{Re}\frac{\partial^2 u}{\partial x^2} - \frac{1}{Fr^2}\cos\theta \tag{15}$$

$$\frac{\partial (C)}{\partial t} + \frac{\partial (Cu_f)}{\partial y} = M_w \tag{16}$$

where $M_w$ is the fluid mass loss at the perforations, u is the fluid velocity, p is the pressure, x is the position along the one-dimensional wellbore, y is the position along the fracture, C is the concentration of diverter in the wellbore fluid, the friction force $f_f$ is modeled as:

$$f_f = \begin{cases} \dfrac{64}{Re} & Re \leq 2300 \\ 0.079 Re^{-0.25} & Re > 2300 \end{cases} \tag{17}$$

and the Reynolds number (Re) and the Froude number (Fr) are defined as:

$$Re = \frac{\rho u_{inlet} D}{\mu} \tag{18}$$

$$Fr = \frac{u_{inlet}}{\sqrt{gD}} \tag{19}$$

where $u_{inlet}$ is the fluid velocity at the wellbore inlet, $\rho$ is wellbore fluid density, $\mu$ is wellbore fluid viscosity and g is gravitational acceleration.

In the fracture domain, the dimensionless fluid mass and momentum conservations are:

$$\frac{\partial (\rho_f)}{\partial t} + \frac{\partial (\rho u_f)}{\partial y} = M_f \tag{20}$$

-continued $$u_f = -Da\frac{\partial p}{\partial y} \qquad (21)$$

$$\frac{\partial(C)}{\partial t} + \frac{\partial(Cu_f)}{\partial y} = 0 \qquad (22)$$

where $\rho_f$ is fracture fluid density, $\mu_f$ is fracture fluid viscosity, y is distance along the fracture, t is time, $M_f$ is fluid mass lost in the fracture, and Da is the Darcy Number, defined as:

$$Da = \frac{K}{D^2}Re \qquad (23)$$

where K is permeability, defined initially as:

$$K = \frac{w^2}{12} \qquad (24)$$

where w is fracture width.

In certain embodiments, connection equations are applied to each of the connection points to properly connect the flow and concentration of diverter in the wellbore and the fracture. Connection equations suitable for certain embodiments of the present disclosure include, but are not limited to mass conservation, pressure continuity, and Reynolds law to model the velocity $u_f$ at all the junction points except the last junction point. Specifically, at any junction point i (i≠N, where N is the number of junction), the connection equations may be as follows:

$$u_{w,in} - u_{w,out} = \frac{2hw}{\pi R_w^2}u_f \qquad (25)$$

$$p_w = p_f \qquad (26)$$

$$u_f = -Da\frac{\partial p}{\partial y} \qquad (27)$$

$$C_w = C_f \qquad (28)$$

where $u_{w,in}$ is wellbore fluid velocity into the junction and $u_{w,out}$ is wellbore fluid velocity out of the junction, h is the fracture height, $C_w$ is the concentration of the diverter in the wellbore, $C_f$ is the concentration of the diverter in the fracture, $p_w$ is the wellbore pressure, $p_f$ is the fracture pressure, and $R_w$ is the flow resistance.

The diversion flow model may comprise a width-pressure model to determine the width of the fracture (w). In some embodiments, the width-pressure model may be described as:

$$w = \frac{2(1-v^2)h}{E}(P - P_{closure}) \qquad (29)$$

where E is the Young's modulus, v is the Poisson's ratio, and $P_{closure}$ is the closure pressure.

The diversion flow model may account for the effect of the diverter on flow. For example, in certain embodiments, the presence of a diverter may cause a reduction in permeability due to, for example, an increase in skin. The diversion flow model may couple permeability reduction due to the presence of a diverter with flow and track the concentration of the diverter. In some embodiments, diverter effects on flow are modeled as:

$$u_f = -\frac{1}{\frac{\mu\log(R_w + \delta)/R_w}{k2\pi L_{perf}} + \frac{\mu\Delta R}{kwh}}\frac{\partial p}{\partial y} \qquad (30)$$

where $\delta$ is the additional resistance to flow caused by the diverter, $L_{perf}$ is the length of the perforation, $\Delta R$ is the change in fracture radius, and k is permeability, which may be computed according to equations (6) and (7). In some embodiments, the diversion flow model captures the effect of the diverter on fluid flow by accounting for the reduction in permeability caused by the diverter based, at least in part, on equation (30).

Figure 6:
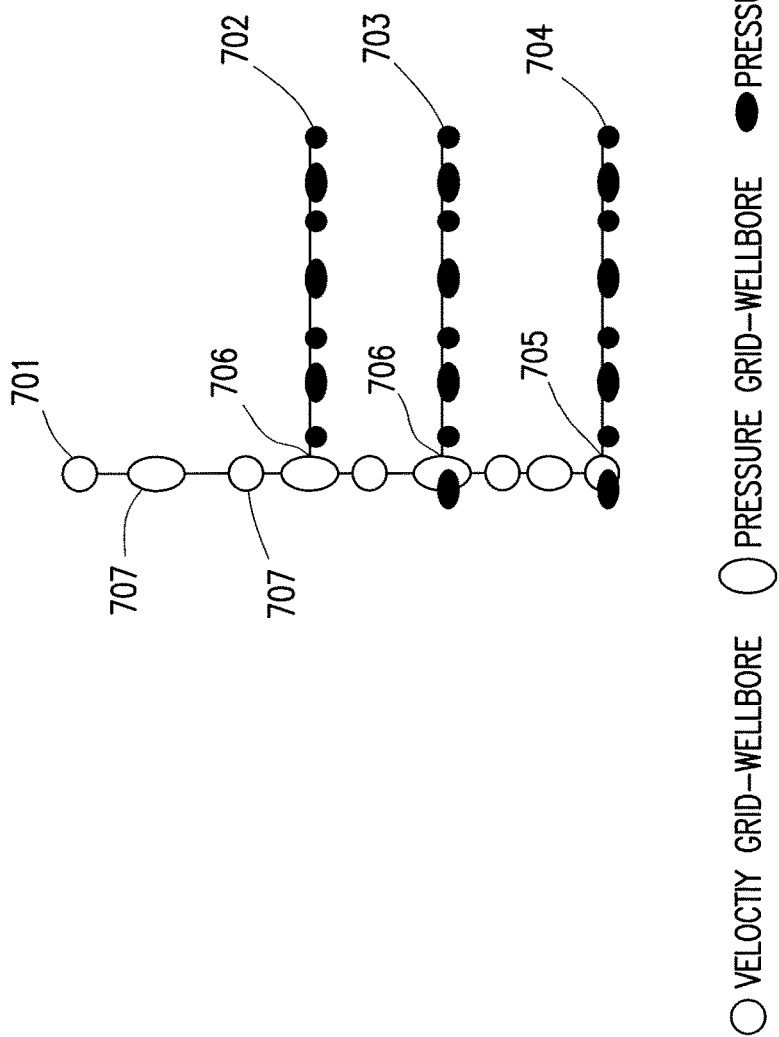
FIG. 6 is an illustration showing a computational grid arrangement for variables in a diversion flow model according to certain embodiments of the present disclosure.

In some embodiments, the diversion flow model may be solved using a numerical solving method, such as a finite difference approach. In a typical finite difference approach, the computational geometry domain may be discretely represented by sequence of connected points called "nodes" or "grid elements" or "a mesh." These nodes can represent locations in one, two, or three dimensions. These nodes need not be uniformly distributed in the computational domain. Some numerical schemes can be optimized or otherwise improved by distributing the nodes in the relevant domain. In certain embodiments, the system of equations for the diversion flow model may be numerically solved by using a first-order implicit method for time, a spatially second-order upwind scheme for convective terms, and a second-order central scheme for second derivatives with the velocity and pressure staggered at discretization nodes as shown in FIG. 6. In certain embodiments, equation (27) may be used everywhere in the fracture domain except at the first grid element 701, where skin may need to be accounted for due to the presence of the diverter. Equation (30) may be used instead of equation (27) at the first grid element at each fracture layer 702, 703 except the last fracture layer 704.

At the last connection point 705, all of the remaining fluid may be assumed to leave the domain. Accordingly, at the last connection point 705, the mass conservation and Reynolds law to model the pressure may be as follows:

$$u_f = \frac{2hw}{\pi R_w^2}u_w \qquad (31)$$

$$\frac{\partial p}{\partial y} = -\frac{1}{Da}u_f \qquad (32)$$

Equation (26) may be used to match the pressure in the wellbore with the pressure in the fracture at all of the junctions 706 except the last junction 705. At the last junction 705, the flow may be matched between the wellbore and the fracture and the pressure may be obtained from the Reynolds law as shown in equation (32). The pressure grid in the wellbore may be connected to the fracture pressure grid in the junctions 706 but at the last junction 705 the velocity grid is connected to the pressure grid to ensure continuity of pressure and velocity in the respective junctions.

Boundary conditions and initial conditions are needed to close the system of equations (14) through (32). In some embodiments, boundary conditions of the diversion flow model include, but are not limited to:

$$u|_{x=0} = u_{inlet} \tag{33}$$

$$\frac{\partial(u)}{\partial y}\bigg|_{y=L_f} = 0 \tag{34}$$

$$p|_{y=L_f} = p_e \tag{35}$$

$$u|_{x=L} = 0 \tag{36}$$

where $L_f$ is the fracture effective length, L is the wellbore length, and $p_e$ is the reservoir pressure.

In some embodiments, the diversion flow model may be solved implicitly. The diversion flow model of the present disclosure may be solved using any suitable numerical solving method. In certain embodiments, the system of equations (14) through (36) may be numerically solved by using a first-order implicit method for time, a spatially second-order upwind scheme for convective terms, and a second-order central scheme for second derivatives with the velocity and pressure staggered at discretization nodes 707 as shown in FIG. 6. The connection equations (equations (25) through (28) and (31) and (32)) are implemented at the connection points 706, 706 to close the system implicitly. Although FIG. 6 shows the variables arranged with their respective discretization nodes 707 in a particular pattern, any suitable pattern could be used to solve the system of equations.

In certain embodiments, the diversion flow model may provide one or more treatment operation outputs. Treatment operation outputs may include, but are not limited to the wellbore system flow distribution, the wellbore system pressure distribution, the formation stress field, any other parameter related to the wellbore or treatment operation, and any combination thereof. For example, in certain embodiments, the wellbore system pressure distribution and wellbore system flow distribution may be determined based, at least in part, on the one or more treatment operation inputs and the diversion flow model. In certain embodiments, a treatment operation is performed based, at least in part, on at least one of the wellbore system pressure distribution and the wellbore system flow distribution.

In certain embodiments, the present disclosure provides an acidizing diversion model for a wellbore system. In certain embodiments, the acidizing diversion model of the present disclosure may capture the effect of a diverter and a bridging agent on flow diversion in the near-wellbore region of a reservoir. In some embodiments, for example, the acidizing diversion model flow model comprises a semi-empirical permeability reduction model. In some embodiments, for example, a permeability reduction model is generated by coupling experimental permeability data with a wellbore system model using a correlation based on dimensional analysis and multi regression.

In certain embodiments, the acidizing diversion model may be used for a variety of applications, including being coupled with other models and computations. The acidizing diversion model may comprise one or more models coupled together, including, but not limited to a wellbore model, a fluid flow model, a junction model, a fracture model, a geomechanical model, an earth model, an energy model, and any combination thereof.

Among the many potential advantages to the methods and systems of the present disclosure, only some of which are alluded to herein, the methods of using the acidizing diversion model of the present disclosure may require less permeability input than traditional models by computing the permeability of the diverter cake implicitly within the model. For example, in certain embodiments, the user may not need to input permeability for the diverter cake for this a diverter since it is computed from the lab data. In addition, the acidizing diversion model may be more physically accurate than models that do not account for the diverter effects on skin and permeability.

In some embodiments, the acidizing diversion model may comprise a one-dimensional acidizing diversion model for diverter and/or bridging agent wellbore system computations. In some embodiments, the acidizing diversion model may account for permeability reduction in the reservoir due to diverter build-up and increased skin due to the presence of a diverter and bridging agent that may be incorporated into flow computations. In some embodiments, an operator or user selects a diverter and a bridging agent for use in an acidizing operation for a wellbore system. In some embodiments, the acidizing diversion model may use a semi-empirical permeability reduction model based on experimental permeability data. In some embodiments, the acidizing diversion model may be used to compare a particular diverting agent (e.g., a newly proposed or developed diverting agent) with existing diverters for the same application.

In some embodiments, the experimental permeability data may be generated by any suitable experimental method, including, but not limited to static fluid loss testing. In certain embodiments, dimensionless analysis may facilitate scaling the experimental permeability data from the laboratory scale to the field. In some embodiments, the variables in the experiments carried out to generate the experimental permeability data may be the permeability of the diverter and bridging agent ($K_{D+BA}$), the average diameter of the particle ($D_p$), the density of the fluid ($\rho_f$), the volume concentration of the diverter and bridging agent ($C_{D+BA}$), the viscosity of the fluid ($\mu$), the width of the fracture (w), the mass ratio of the bridging agent ($M_{BA}$), the mass ratio of the diverter ($M_D$), and time (t). These variables may be combined into the following five dimensionless groups:

$$\frac{K_{D+BA}}{w^2}$$

$$\frac{u_f t}{\rho_f D_p^2}$$

$$\frac{w}{D_p}$$

$$\frac{\rho_f}{C_{D+BA}}$$

$$\frac{M_{BA}}{M_D}$$

The dimensionless groups may be combined as follows:

$$\frac{K_{D+BA}}{K} = \frac{1}{1 + A\left(\frac{u_f t}{\rho_f D_p^2}\right)^a \left(\frac{W}{D_p}\right)^b \left(\frac{\rho_f}{C_{D+BA}}\right)^c \left(\frac{M_{BA}}{M_D}\right)^d} \tag{37}$$

where K is the initial permeability of the reservoir, which may be calculated as $K = w^2/12$. At $t=0$, $$\frac{K_{D+BA}}{K} = 1$$

and as t becomes big, $$\frac{K_{D+BA}}{K}$$

may go to zero. In certain embodiments, generating the permeability reduction model comprises fitting the experimental permeability data to the equation (37). In some embodiments, experimental permeability data may be fit to equation (37) to determine the fit constants a, b, c, d, and A. These fit constants may, in certain embodiments, be used to calculate permeability for the wellbore system according to equation (37).

The reservoir permeability may decrease in the presence of the diverter and bridging agent due to the presence of solid particles. As permeability decreases, the flow rate may decrease as well. In certain embodiments, the effect of the reduction in permeability on flow rate may be described as follows:

$$q = \frac{2\pi K_{D+BA} \Delta P l}{\mu \left( \log \frac{r_{perf} + \delta_{cake}}{r_{perf}} \right)} \quad (38)$$

where $\delta_{cake}$ is the diverter cake thickness, $r_{perf}$ is the radius of the perforation, $\Delta P$ is the pressure drop in the perforation and l is the length of the perforation. In certain embodiments, skin increases in the presence of the diverter cake thickness from equation (38), which may decrease the flow rate and cause fluid diversion. If $K_{D+BA}$ goes to zero, flow through the portion of the reservoir may go to zero. Thus, in some embodiments, the flow may get diverted to the other zones. In some embodiments, the effect of the reduction in permeability on flow may be incorporated into one or more other models of the present disclosure, including, but not limited to an integrated diversion model, a diversion flow model, a wellbore model, a fluid flow model, a diverter transport model, and any combination thereof.

Figure 7:
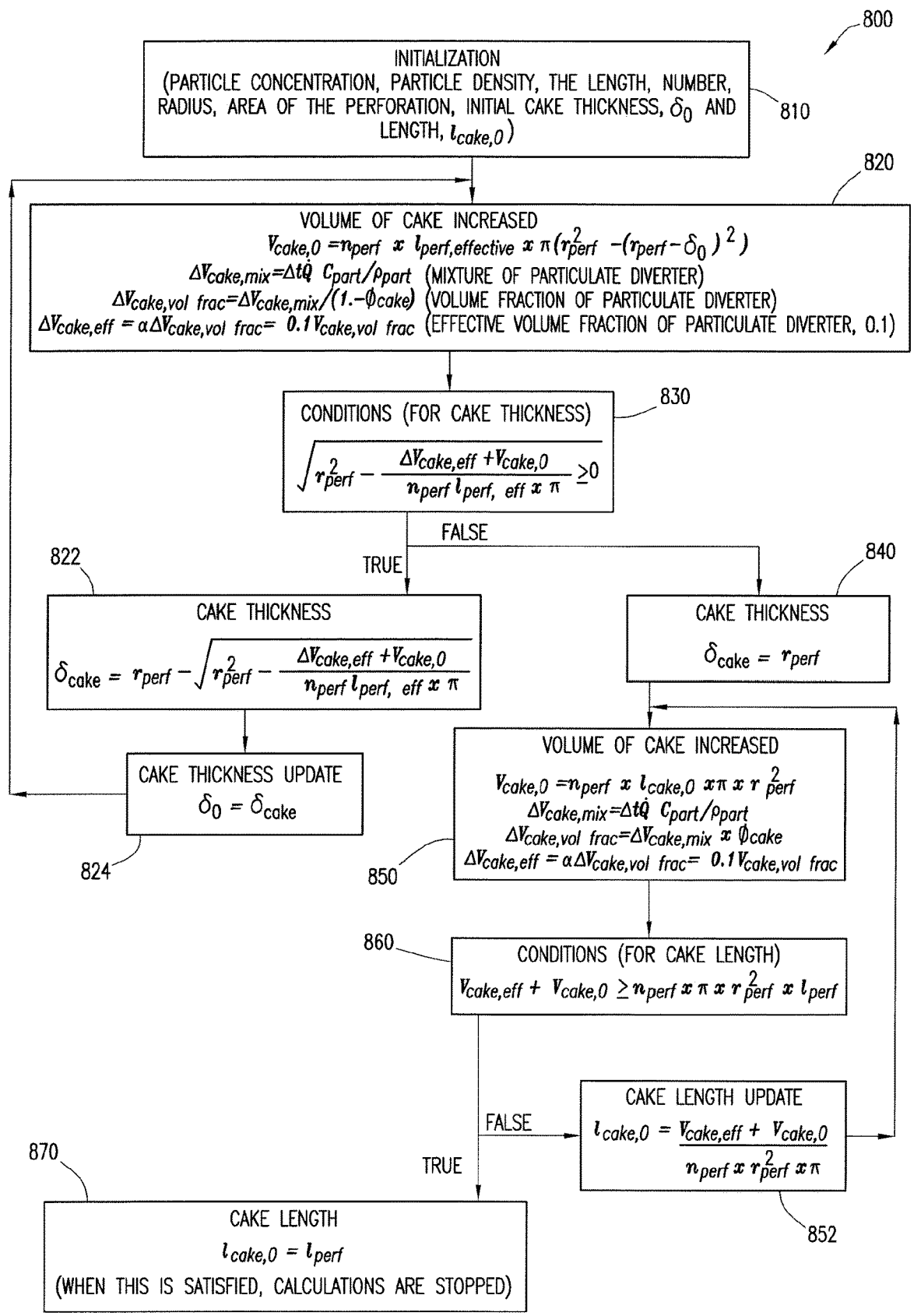
FIG. 7 is a diagram depicting a process flow for determining skin for perforation completions according to certain embodiments of the present disclosure.

In some embodiments, skin is calculated for the wellbore system based, at least in part, on the thickness of the diverter cake. In certain embodiments, the cake thickness may depend, at least in part, on the presence of a diverter and bridging agent. FIG. 7 depicts a process flow 800 for determining skin for wellbore systems comprising perforation completions based, at least in part, on the diverter cake thickness. The use of arrows in FIG. 7 is not meant to require any particular order in which the process flow must be performed, and any order of performing these steps is contemplated by the present disclosure and claims. In certain embodiments, the process flow 800 comprises determining the initial variables 810, including, but not limited to the particle concentration ($C_{part}$), particle density ($\rho_{part}$), perforation length ($l_{perf}$), the number of perforations ($n_{perf}$), the perforation radius ($r_{perf,o}$), the area of the perforation ($A_{perf}$), the initial cake thickness ($\delta_o$), and the initial cake length ($l_{cake,o}$). A person of ordinary skill in the art will appreciate that these initial variables may be measured, calculated, estimated, or any combination thereof.

In some embodiments, the process flow 800 may comprise calculating the increase in diverter cake volume 820 based, at least in part, on the diverter cake thickness. In certain embodiments, the increase in diverter cake volume 820 may be calculated as follows:

$$V_{cake,o} = n_{perf} l_{perf,effective} \pi (r_{perf}^2 - (r_{perf} - \delta_0)^2) \quad (39)$$

$$\Delta V_{cake,mix} = \Delta t \dot{Q} C_{part} / \rho_{part} \quad (40)$$

$$\Delta V_{cake,vol\,frac} = \Delta V_{cake,mix} / (1 - \phi_{cake}) \quad (41)$$

$$\Delta V_{cake,eff} = \alpha \Delta V_{cake,vol\,frac} \quad (42)$$

where $V_{cake,o}$ is the initial cake volume, $l_{perf,eff}$ is the effective length of the perforations, $\Delta V_{cake,mix}$ is the change in volume of the mixture comprising the particulate diverter, $\dot{Q}$ is the volumetric flow rate, $\Delta t$ is the time step, $\phi_{cake}$ is the volume fraction of the particulate diverter, $\Delta V_{cake,vol\,frac}$ is the change in cake volume with a correction applied for the effective volume of the diverter, $\alpha$ is a correction factor for effective volume, and $\Delta V_{cake,eff}$ is the change in cake volume modified for the effective volume fraction of the diverter. The effective volume factor $\alpha$ may range from 0 to 1. In some embodiments, $\alpha$ is 0.1.

In certain embodiments, the process flow 800 may comprise calculating whether the following condition is satisfied 830.

$$\sqrt{r_{perf}^2 - \frac{\Delta V_{cake,eff} + V_{cake,o}}{n_{perf} l_{perf,effective} \pi}} \geq 0 \quad (43)$$

Without being bound by theory, equation (43) may generally represent whether the area of the perforation is blocked by the cake. If the condition in equation (43) is true, the cake has not yet blocked the perforation. If the condition in equation (43) is false, the cake has blocked the perforation.

In certain embodiments, if the condition in equation (43) is true, cake thickness is recalculated 822 according to following:

$$\delta_{cake} = r_{perf} - \sqrt{r_{perf}^2 - \frac{\Delta V_{cake,eff} + V_{cake,o}}{n_{perf} l_{perf,effective} \pi}} \quad (44)$$

The initial cake thickness may then be set equal to the recalculated cake thickness ($\delta_o = \delta_{cake}$) 824 and the volume of cake increased may be recalculated 820 using equations (39) through (42) based on the new initial cake thickness. In certain embodiments, equation (43) may be evaluated again to determine whether it is true or false 830. In some embodiments, the process flow 800 may comprise iteratively calculating the cake thickness 822 and the increase in diverter cake volume 820.

In certain embodiments, if the condition in equation (43) is determined be false during the process flow 800, then cake thickness may be assumed to be equal to the radius of the perforation 840 ($\delta_{cake} = r_{perf}$) and the increase in cake volume may be determined 850 based, at least in part, on an initial diverter cake length ($l_{cake,o}$) as follows:

$$V_{cake,o} = n_{perf} l_{cake,o} \pi r_{perf}^2 \quad (45)$$

$$\Delta V_{cake,mix} = \Delta t \dot{Q} C_{part} / \rho_{part} \quad (46)$$

$$\Delta V_{cake,vol\,frac} = \Delta V_{cake,mix} \phi_{cake} \quad (47)$$

$$\Delta V_{cake,eff} = \alpha \Delta V_{cake,vol\,frac} \quad (48)$$

In certain embodiments, the process flow 800 may comprise calculating whether the following condition 860 is satisfied:

$$\Delta V_{cake,eff} + V_{cake,o} \geq n_{perf} \pi r_{perf}^2 l_{perf} \quad (49)$$

Without being bound by theory, equation (49) may generally represent whether the entire length of the perforation is blocked by the diverter cake. If the condition in equation (49) is true, the diverter cake may not block the entire length of the perforation. If the condition in equation (49) is false, the cake may block the entire length of the perforation.

In certain embodiments, if equation (49) is false, cake length may be recalculated 852 as follows:

$$l_{cake,o} = \frac{\Delta V_{cake,eff} + V_{cake,o}}{n_{perf} r_{perf}^2 \pi} \quad (50)$$

The increased cake volume may then be recalculated 850 using equations (45) though (48) based, at least in part, on the recalculated cake length 852.

In certain embodiments, if the condition in equation (49) is true, the initial cake length ($l_{cake,o}$) is set equal to the perforation length ($l_{perf}$) 870 and the process flow 800 is complete. In certain embodiments, the skin calculated by the process flow 800 may be used in the acidizing diversion model. For example, in some embodiments, the diverter cake thickness calculated using the process flow 800 may be used to solve for the flow rate using equation (38).

In certain embodiments, the acidizing diversion model comprising the semi-empirical permeability reduction model may be used to simulate an acidizing operation. For example, in some embodiments, an acidizing operation is simulated based, at least in part, on applying the acidizing diversion model to one or more parameters characterizing the acidizing operation. The one or more parameters characterizing the acidizing operation may include, but are not limited to an amount of diverter pumped into the wellbore system, the wellbore pressure at the injection points, the flow rate at the wellbore inlet, the pressure at the wellbore inlet, the amount of acid pumped in the wellbore system, concentration of the acid pumped, a formation property, a wellbore property, and any other suitable parameter characterizing the acidizing operation. In some embodiments, the simulated acidizing operation may be displayed on a display coupled to a processing component. In certain embodiments, the acidizing operation may be performed on the wellbore system.

In some embodiments, a diverter may comprise any material suitable for distribution within or into a flowpath, for example, so as to form a pack or bridge and thereby cause fluid movement via that flowpath to cease or be reduced. For example, the diverter may comprise a material configured to increase the resistance to fluid via a given point of entry (POE) (e.g., into a given interval or fracture) such that fluid movement is diverted to another POE (e.g., into another fracture and/or via another flowpath into the same fracture). In an embodiment, the diverter may comprise a suitable degradable material capable of undergoing an irreversible degradation downhole. As used herein, the term "irreversible" means that the degradable material, once degraded downhole, should not recrystallize or reconsolidate while downhole (e.g., the degradable material should degrade in situ but should not recrystallize or reconsolidate in situ). As used herein, the terms "degradation" or "degradable" may refer to either or both of heterogeneous degradation (or bulk erosion) and/or homogeneous degradation (or surface erosion), and/or to any stage of degradation in between these two. Not intending to be bound by theory, degradation may be a result of, inter alia, a chemical reaction, a thermal reaction, a reaction induced by radiation, or combinations thereof.

In an embodiment, the degradable material may comprise degradable polymers, dehydrated salts, or combinations thereof. In an embodiment where the degradable material comprises a degradable polymer, such a degradable polymer may generally comprise a polymer that degrades due to, inter alia, a chemical and/or radical process such as hydrolysis, oxidation, or UV radiation. As may be appreciated by one of skill in the art upon viewing this disclosure, the degradability of a polymer may depend at least in part on its backbone structure. For example, the presence of hydrolyzable and/or oxidizable linkages within the backbone structure may yield a material that will degrade as described herein. As may also be appreciated by one of skill in the art upon viewing this disclosure, the rates at which such polymers degrade may be at least partially dependent upon the type of repetitive unit, composition, sequence, length, molecular geometry, molecular weight, morphology (e.g., crystallinity, size of spherulites, and orientation), hydrophilicity, hydrophobicity, surface area, and additives. Additionally, the environment to which a given polymer is subjected may also influence how it degrades, (e.g., temperature, presence of moisture, oxygen, microorganisms, enzymes, pH, the like, and combinations thereof).

Examples of suitable degradable polymers include, but are not limited to homopolymers, random, block, graft, star- and hyper-branched aliphatic polyesters, and any combination thereof. Polycondensation reactions, ring-opening polymerizations, free radical polymerizations, anionic polymerizations, carbocationic polymerizations, coordinative ring-opening polymerization, and any other suitable process may be utilized to prepare such suitable polymers. Specific examples of suitable polymers include, but are not limited to, polysaccharides such as dextran or cellulose; chitins; chitosans; proteins; aliphatic polyesters; poly(lactides); poly(glycolides); poly(c-caprolactones); poly(hydroxybutyrates); poly(anhydrides); aliphatic polycarbonates; poly(orthoesters); poly(amino acids); poly(ethylene oxides); polyphosphazenes, and combinations thereof. In some embodiments, the diverter comprises poly(latic) acid (PLA).

In some embodiments, a bridging agent may be a material added to a treatment fluid to prevent loss of fluid or excess filtrate. Without being bound by theory, it is believed that bridging agents bridge across the pore throat or fractures of an exposed rock, thereby building a filter cake. Bridging agents are commonly used in drilling fluids and in lost circulation treatments. Examples of bridging agents suitable for some embodiments of the present disclosure include, but are not limited to calcium carbonate, baracarbonate (BC), suspended salt, oil-soluble resins, and any combination thereof. In some embodiments, the bridging agent is BARACARB®, available from Halliburton Energy Services, Inc. in Houston, Tex. For reservoir applications, a bridging agent may be removable. For lost-circulation treatments, any suitably sized products can be used, including, but not limited to mica, nutshells, fibers, and any combination thereof.

Figure 8:
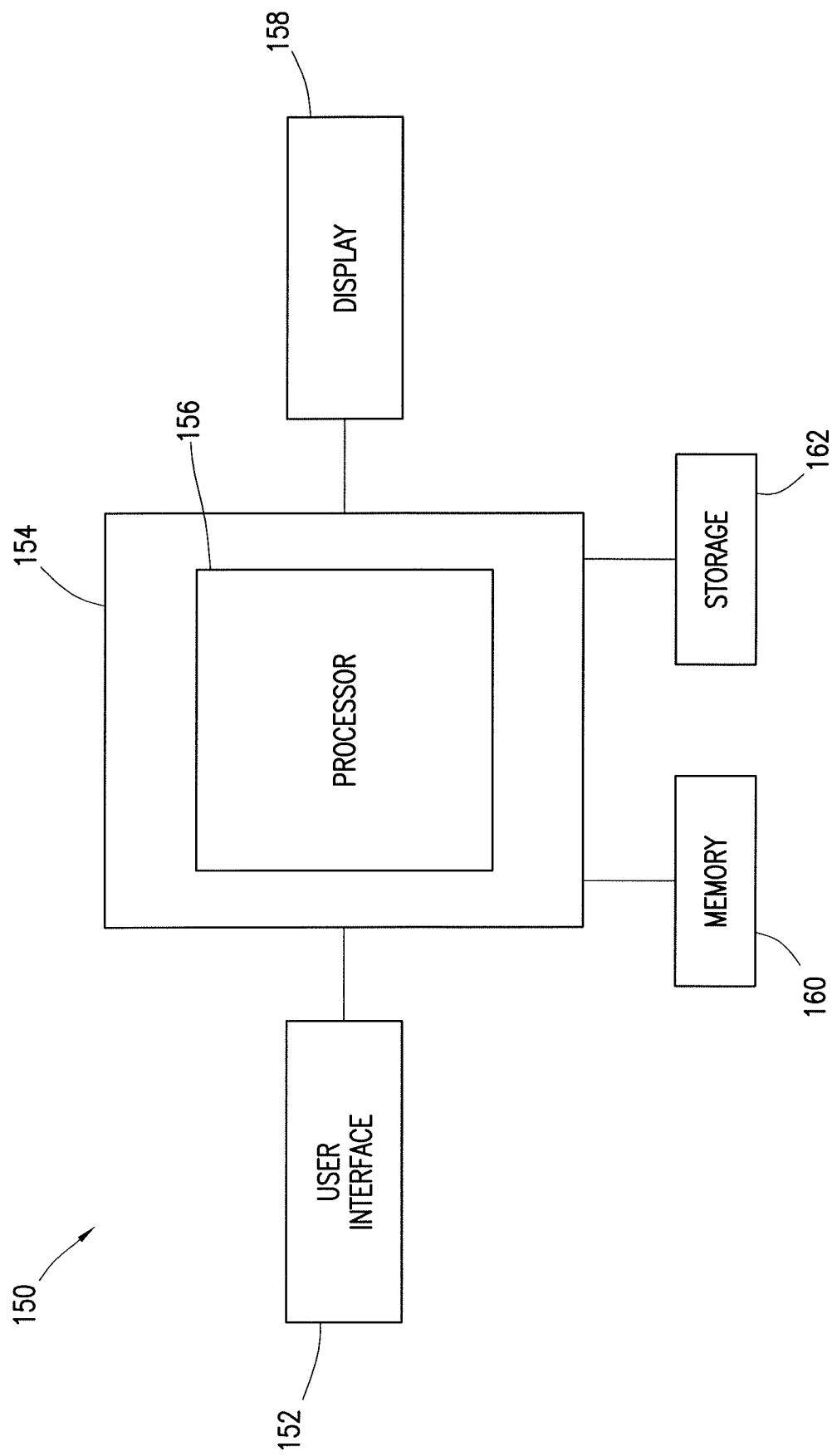
FIG. 8 is a block diagram of a simulation system that may be used to construct one or more models of the present disclosure and to simulate a wellbore system according to certain embodiments of the present disclosure.

FIG. 8 is a block diagram of a simulation system 150 that may be used to construct one or more models of the present disclosure and to simulate a wellbore system according to certain embodiments of the present disclosure. For example, the simulation system 150 may be used to construct one or more of the diversion models of the present disclosures, such as the integrated diversion model, diversion flow model, or acidizing diversion model of the present disclosure. As illustrated, the system 150 may comprise a user interface 152, a processor unit 154 having one or more processing components 156, a display 158, a memory 160, and a storage component 162. It should be noted that the illustrated system 150 is meant to be representative, and other simulation systems 150 may include additional components or may operate in the absence of certain illustrated components.

The user interface 152 may be available for an operator or user to input parameters or properties of the system that is being modeled. Such inputs may include, but are not limited to, wellbore treatment inputs, formation inputs, treatment operation inputs, acidizing operation parameters, information relating to the geometry of the subterranean formation and/or the wellbore, inlet flow rate, inlet pressure, any other suitable input, and any combination thereof. In addition, the inputs may include information relating to the desired method for modeling and simulating the system, such as specific discretization schemes to be used or assumptions to be made (e.g., assumptions to be made at junctions).

The illustrated processing unit 154 includes a processing component 156, which may be designed to receive various inputs from the user interface 152. In addition, the processing component 156 may be operably coupled to the memory 160 and the storage component 162 to execute instructions for carrying out the presently disclosed methods. These instructions may be encoded in programs that may be executed by the processing component 156 to generate the one or more diversion models of the present disclosure and simulate diversion. These codes may be stored in any suitable article of manufacture that includes at least one tangible non-transitory, computer-readable medium (e.g., a hard drive) that at least collectively stores these instructions or routines, such as the memory component 160 or the storage component 162.

The display 158 coupled to the processing unit 154 may be used to visibly display the diversion simulations computed on the processing component 156. However, in other embodiments the display 158 may provide other types of indications related to the simulated diversion. For example, in certain embodiments, the display 158 may display a simulation representative of the formation stress field.

Figure 9:
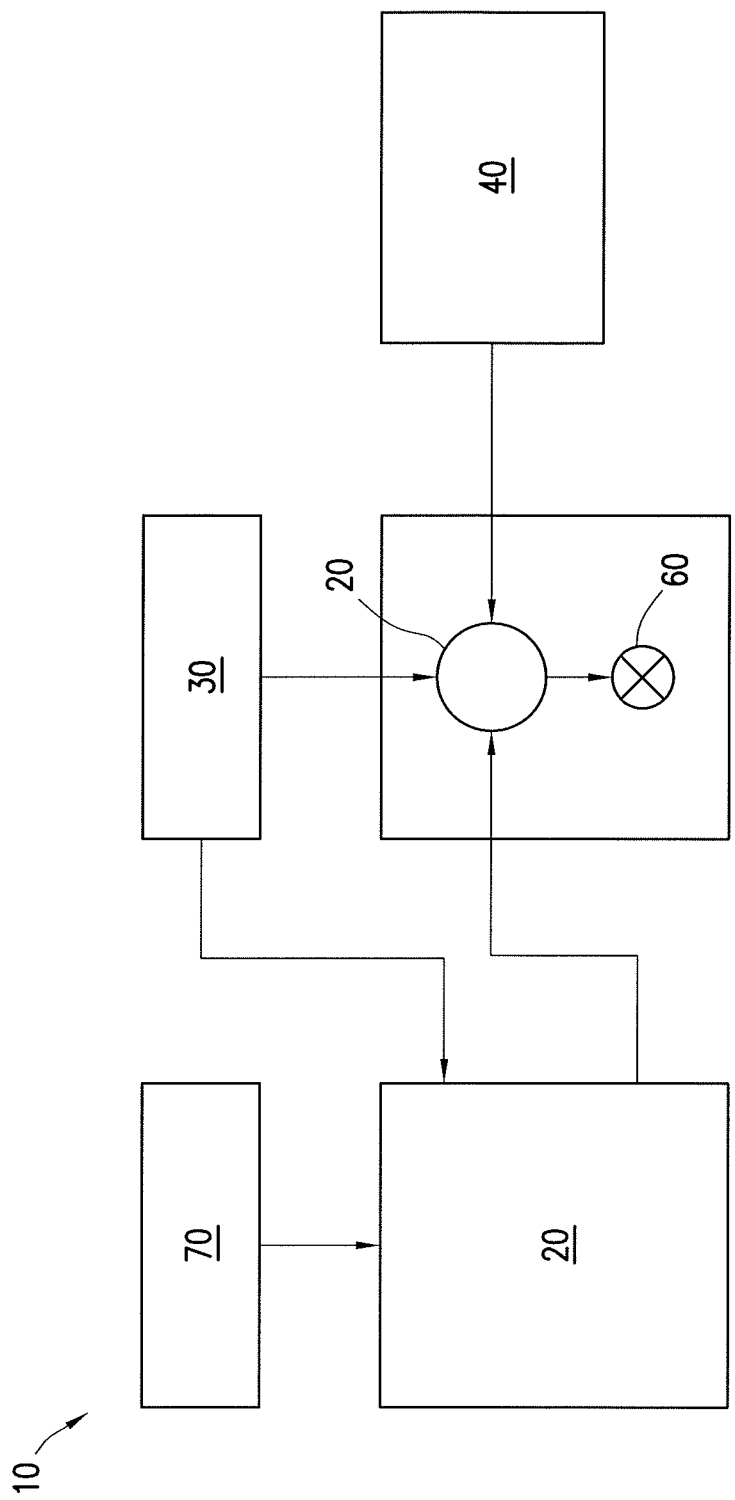
FIG. 9 is a diagram illustrating an example of a stimulation system that may be used in accordance with certain embodiments of the present disclosure.

Certain embodiments of the methods disclosed herein may directly or indirectly affect one or more components or pieces of equipment associated with the preparation, delivery, recapture, recycling, reuse, and/or disposal of wellbore compositions. For example, and with reference to FIG. 9, the disclosed methods may directly or indirectly affect one or more components or pieces of equipment associated with a stimulation system 10, according to one or more embodiments. In certain embodiments, the system 10 includes a fluid producing apparatus 20, a fluid source 30, an optional proppant source 40, and a pump and blender system 50 and resides at the surface at a well site where a well 60 is located. The fluid can be a fluid for ready use in a fracture stimulation treatment or acidizing treatment of the well 60. In other embodiments, the fluid producing apparatus 20 may be omitted and the fluid sourced directly from the fluid source 30.

The optional proppant source 40 can include a proppant for combination with a fracturing fluid. However, in some embodiments, the proppant source 40 may be omitted such that the treatment fluid formed using the fluid producing apparatus 20 does not include a significant amount of solid materials/particulates. The system 10 may also include additive source 70 that provides one or more additives (e.g., diverters, bridging agents, gelling agents, weighting agents, and/or other optional additives) to alter the properties of the fluid. For example, the other additives 70 can be included to reduce pumping friction, to reduce or eliminate the fluid's reaction to the geological formation in which the well is formed, to operate as surfactants, and/or to serve other functions. In some embodiments, the diverter and bridging agent of the present disclosure may be introduced into a fluid via additive source 70.

The pump and blender system 50 may receive the fluid and combine it with other components, including proppant from the optional proppant source 40 and/or additional components from the additives source 70. In certain embodiments, the resulting mixture may be pumped down the well 60 under a pressure sufficient to create or enhance one or more fractures in a subterranean zone, for example, to stimulate production of fluids from the zone. In certain embodiments, the resulting mixture may be pumped down the well 60 at a pressure suitable for an acidizing operation. Notably, in certain instances, the fluid producing apparatus 20, fluid source 30, and/or optional proppant source 40 may be equipped with one or more metering devices or sensors (not shown) to control and/or measure the flow of fluids, proppants, diverts, bridging agents, and/or other compositions to the pumping and blender system 50. In certain embodiments, the metering devices may permit the pumping and blender system 50 to source from one, some or all of the different sources at a given time, and may facilitate the preparation of fluids in accordance with the present disclosure using continuous mixing or "on-the-fly" methods. Thus, for example, the pumping and blender system 50 can provide just fluid into the well at some times, just additives at other times, and combinations of those components at yet other times.

While not specifically illustrated herein, the disclosed methods and systems may also directly or indirectly affect any transport or delivery equipment used to convey wellbore compositions to the system 50 such as, for example, any transport vessels, conduits, pipelines, trucks, tubulars, and/or pipes used to fluidically move compositions from one location to another, any pumps, compressors, or motors used to drive the compositions into motion, any valves or related joints used to regulate the pressure or flow rate of the compositions, and any sensors (e.g., pressure and temperature), gauges, and/or combinations thereof, and the like.

Figure 10:
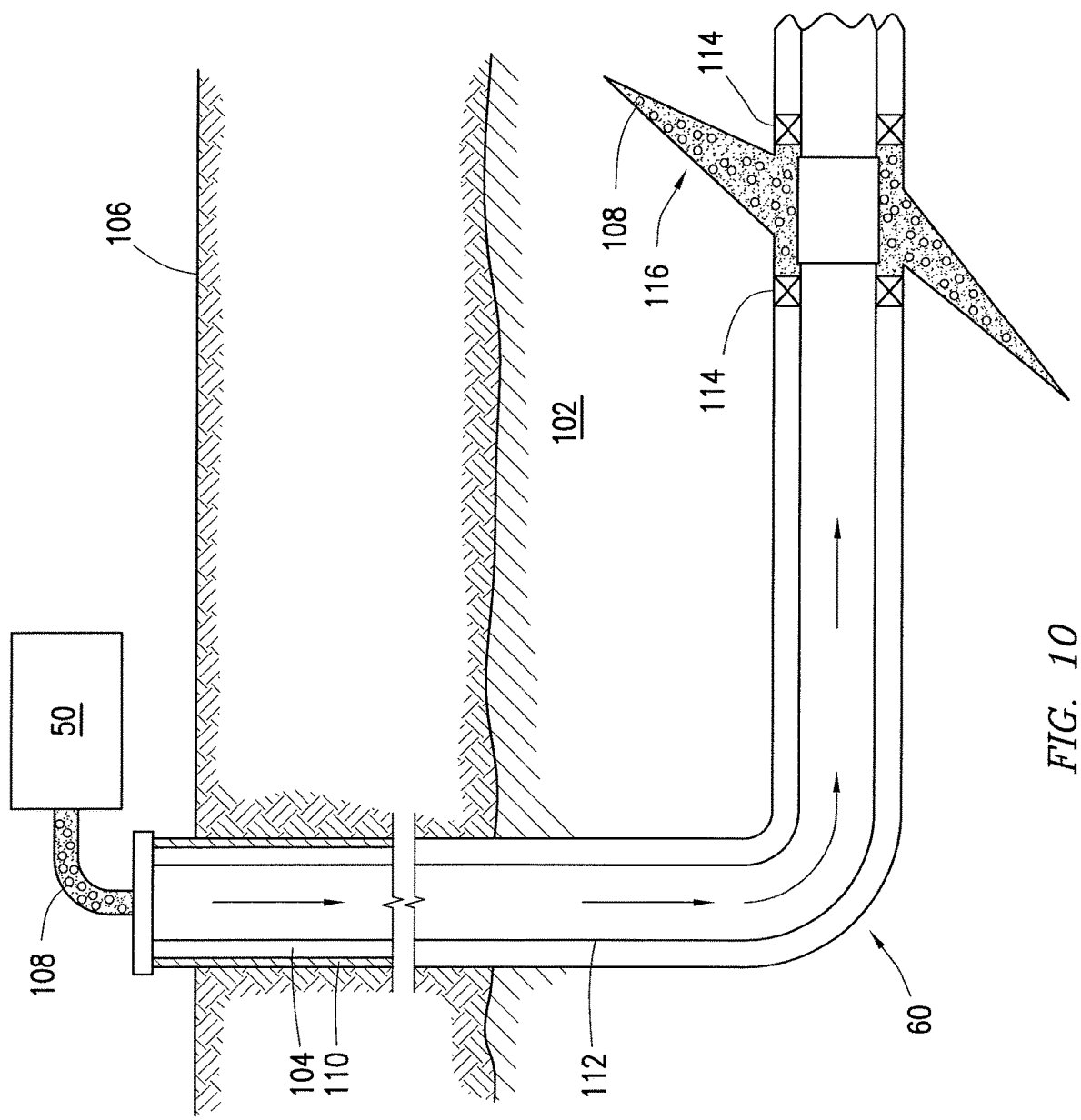
FIG. 10 is a diagram illustrating an example of a subterranean formation in which a fracturing operation may be performed in accordance with certain embodiments of the present disclosure.

FIG. 10 shows a well 60 during a fracturing operation in a portion of a subterranean formation of interest 102 surrounding a wellbore 104 according to certain embodiments of the present disclosure. The wellbore 104 extends from the surface 106, and the fracturing fluid 108 is applied to a portion of the subterranean formation 102 surrounding the horizontal portion of the wellbore. Although shown as vertical deviating to horizontal, the wellbore 104 may include horizontal, vertical, slant, curved, and other types of wellbore 104 geometries and orientations, and the fracturing treatment may be applied to a subterranean zone surrounding any portion of the wellbore. The wellbore 104 can include a casing 110 that is cemented or otherwise secured to the wellbore wall. The wellbore 104 can be uncased or include uncased sections. Perforations can be formed in the casing 110 to allow fracturing fluids and/or other materials (e.g., a diverter) to flow into the subterranean formation 102. In cased wells, perforations can be formed using shape charges, a perforating gun, hydro jetting and/or other tools.

The well 60 is shown with a work string 112 depending from the surface 106 into the wellbore 104. The pump and blender system 50 is coupled to a work string 112 to pump the fracturing fluid 108 into the wellbore 104. The working string 112 may include coiled tubing, jointed pipe, and/or other structures that allow fluid to flow into the wellbore 104. The working string 112 can include flow control devices, bypass valves, ports, and or other tools or well devices that control a flow of fluid from the interior of the working string 112 into the subterranean zone 102. For example, the working string 112 may include ports adjacent the wellbore wall to communicate the fracturing fluid 108 directly into the subterranean formation 102, and/or the working string 112 may include ports that are spaced apart from the wellbore wall to communicate the fracturing fluid 108 into an annulus in the wellbore between the working string 112 and the wellbore wall.

The working string 112 and/or the wellbore 104 may include one or more sets of packers 114 that seal the annulus between the working string 112 and wellbore 104 to define an interval of the wellbore 104 into which the fracturing fluid 108 will be pumped. FIG. 10 shows two packers 114, one defining an uphole boundary of the interval and one defining the downhole end of the interval. When the fracturing fluid 108 is introduced into wellbore 104 (e.g., in FIG. 10, the area of the wellbore 104 between packers 114) at a sufficient hydraulic pressure, one or more fractures 116 may be created in the subterranean formation 102. The proppant particulates in the fracturing fluid 108 may enter the fractures 116 as shown, or may plug or seal off fractures 116 to reduce or prevent the flow of additional fluid into those areas.

Figure 11:
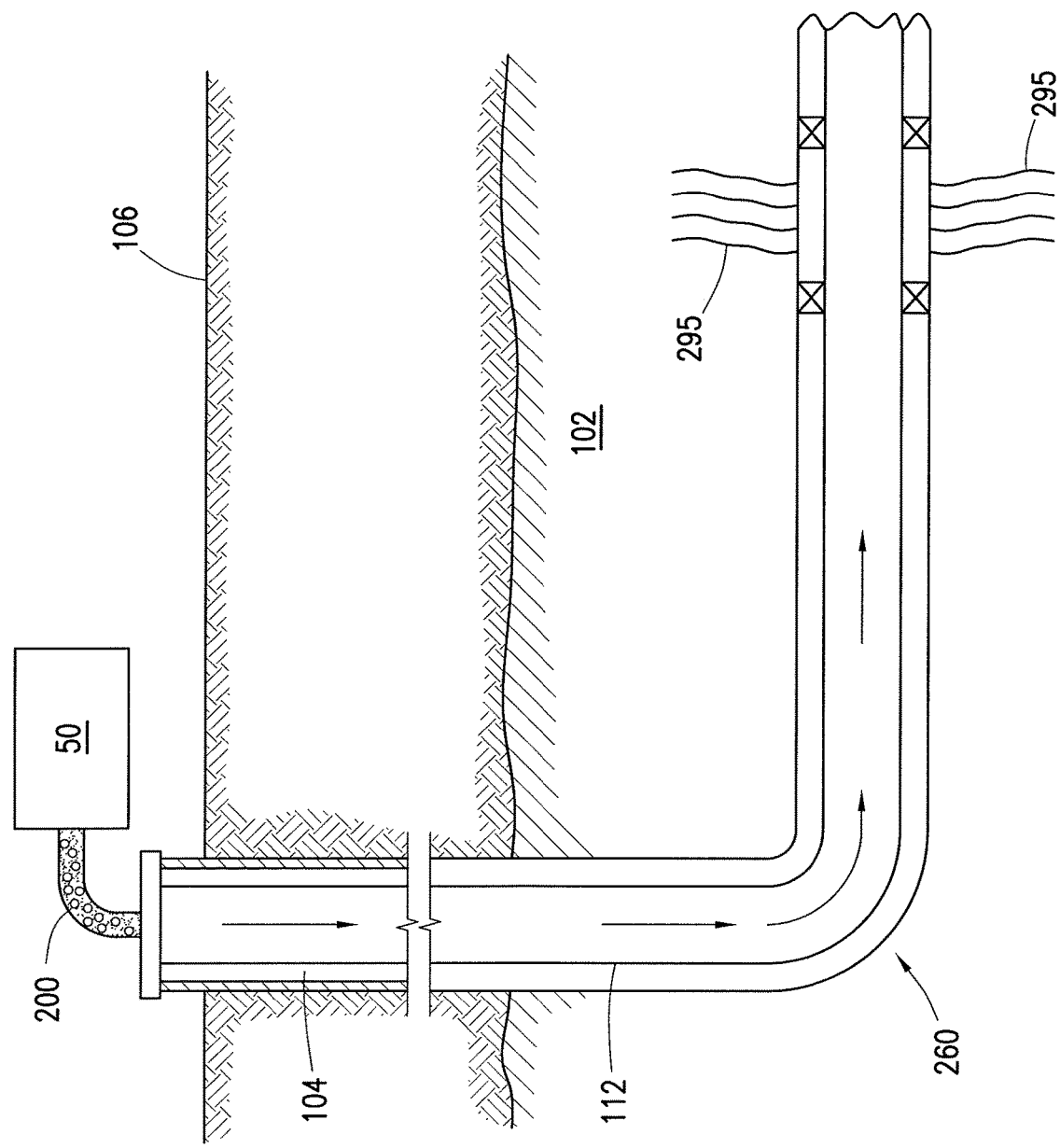
FIG. 11 is a diagram illustrating an example of a subterranean formation in which an acidizing operation may be performed in accordance with certain embodiments of the present disclosure.

Referring now to FIG. 11, a well 260 is shown during an acidizing operation according to certain embodiments of the present disclosure in a portion of a subterranean formation of interest 102 surrounding a wellbore 104. The subterranean formation of interest 102 may comprise acid-soluble components. The subterranean formation may be a carbonate formation, sandstone formation, mixed carbonate-sandstone formation, or any other subterranean formation suitable for an acidizing treatment. The wellbore 104 can include a casing 110 that is cemented or otherwise secured to the wellbore wall. The wellbore 104 can be uncased or include uncased sections. A pump and blender system 50 is coupled to a work string 112 to pump an acidizing fluid 200 into the wellbore 104.

In some embodiments, the working string 112 may include ports adjacent the wellbore wall to communicate the acidizing fluid 200 directly into the subterranean formation 102, and/or the working string 112 may include ports that are spaced apart from the wellbore wall to communicate the acidizing fluid 200 into an annulus in the wellbore 104 between the working string 112 and the wellbore wall.

As shown, the wellbore 104 penetrates a portion of the subterranean formation 102, which may include a hydrocarbon-bearing reservoir. In some cases, an acidizing fluid 200 may be pumped through the working string 112 and into the portion of the formation 102. In some embodiments, the acidizing fluid 308 may create wormholes 295 in the portion of the subterranean formation 102.

Figure 12:
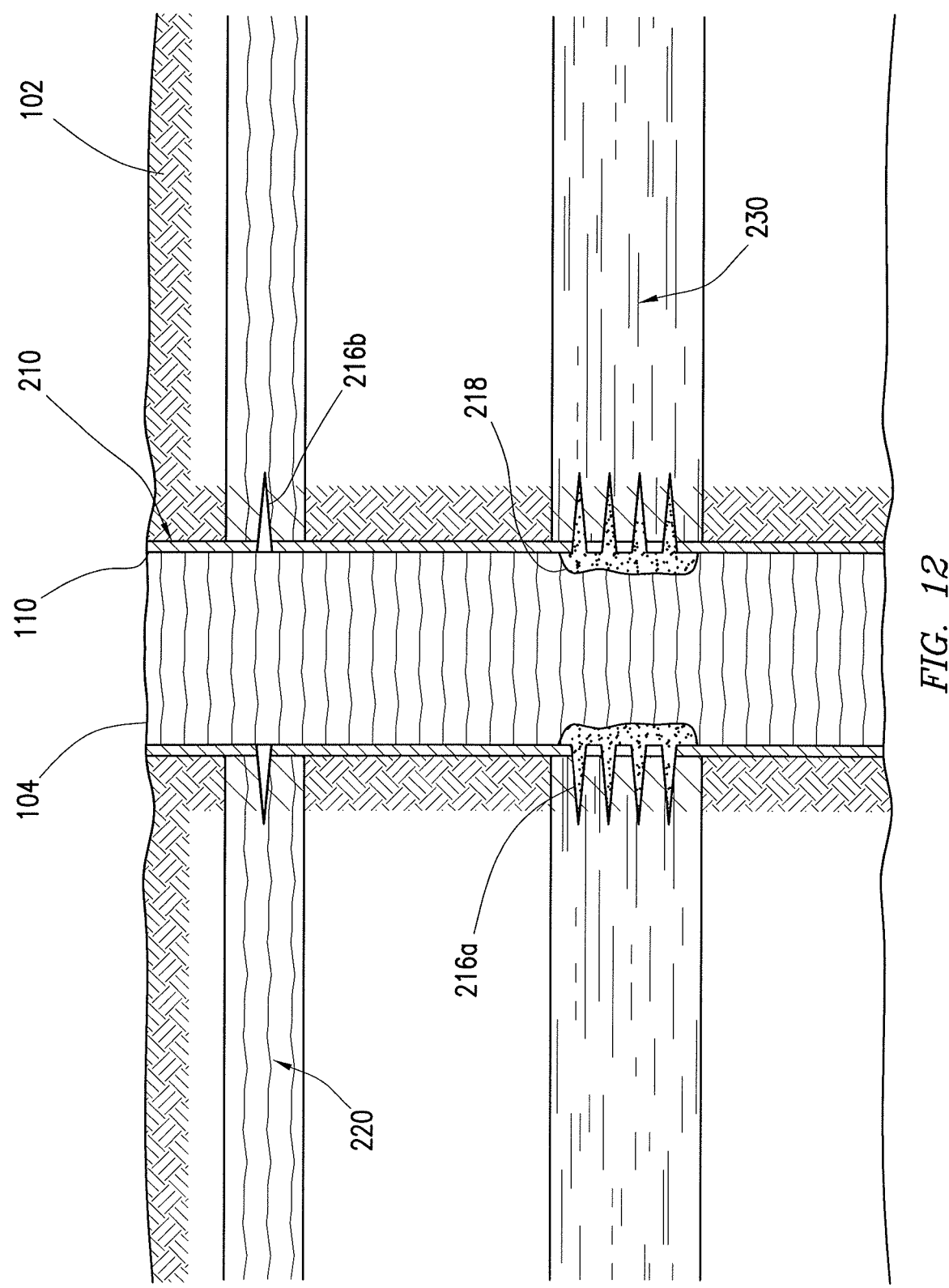
FIG. 12 is a diagram illustrating an example of a portion of a subterranean formation with multiple zones in which a diverter may be used in accordance with certain embodiments of the present disclosure.

FIG. 12 shows a side view of a subterranean formation 102 penetrated by a wellbore 104 with casing 110 placed in the wellbore 104. The wellbore 104 penetrates two zones 220 and 230 in the subterranean formation 102, wherein the fluid flow resistance of zone 220 is higher than the fluid flow resistance of zone 230. Perforations 216a, 216b have been created in the casing 110 to allow for fluid flow into the zones 220 and 230. In some embodiments, perforation clusters 216a, 216b may comprise one or more perforations. In certain embodiments, a perforation cluster 216a, 216b is a number of perforations shot over a finite interval, separated from another perforation cluster 216a, 216b or other clusters within the same pay zone spaced away from that cluster by another finite interval. In some embodiments, a perforation cluster 216a, 216b may be characterized by one or more parameters, including, but not limited to perforation length, the total number of perforations, the perforation radius, and the spacing between clusters.

In certain embodiments, a treatment fluid comprising a diverter and/or a bridging agent may be introduced into at least a portion of the perforations 212 within zone 230 or adjacent to a least a portion of zone 230 of the subterranean formation 102 using one or more pumps.

Once introduced into the wellbore 104, the diverter and/or bridging agent may form a bridge 218 to plug or partially plug zone 230. The treatment fluid may then be diverted by bridge 218 to the less permeable zone 220 of the subterranean formation 102. The treatment fluid may then create or enhance one or more fractures in the less permeable zone 220 of the subterranean formation 102.

After diverting the treatment fluid, the bridge 218 may degrade over time to at least partially unplug zone 230. In another embodiment, this diverting procedure may be repeated with respect to each of a second, third, fourth, or more, treatment stages (not shown) to divert the treatment fluid to further less permeable zones of the subterranean formation.

To facilitate a better understanding of the present disclosure, the following examples of certain aspects of preferred embodiments are given. The following examples are not the only examples that could be given according to the present disclosure and are not intended to limit the scope of the disclosure or claims.

Example 1

According to aspects of the present disclosure, an example integrated diversion model was generated for an example vertical well with the following properties: true vertical depth (TVD) of 10,000 ft.; inlet flow rate of 10 barrels per minute (bpm); inlet pressure of 7000 psi; wellbore diameter of 0.0254 m; 6 perforations clusters per stage of completion; 6 shots per foot; a cluster length of 0.03 m; and a perforation diameter of 0.42 in. In this example, the clusters were 50 ft apart and about 200 lbs of diverter were pumped with an average diameter of 0.0006 m. The density and viscosity of the wellbore fluid were chosen as 1000 kg/m$^3$ and 0.001 Pa·s, respectively. The minimum stress, Poisson's ratio, Young's modulus and stress intensity factor were $2.51 \times 10^7$, 0.3, $1 \times 10^{10}$ and $8 \times 10^5$, respectively, and the fracture height was assumed to be 3 m. Permeability was computed from equation (6) above to be $3 \times 10^{-9}$ and the porosity was calculated from equation (7) above to be 0.535. Table 1 shows the details of the flow and pressure before and after the diversion. As shown in Table 1, the diverter redirected the flow from the most dominant clusters to the non-dominant clusters.

TABLE 1

| | Without Diverter | | | With Diverter | | | |
|---|---|---|---|---|---|---|---|
| Cluster # | Well Pressure (psi) | Pressure at the Tip (psi) | Flow Rate (bpm) | Diverter Mass (lbs) | Well Pressure (psi) | Pressure at the Tip (psi) | Flow Rate (bpm) |
| 1 | $2.84 \times 10^7$ | $2.79 \times 10^7$ | 0.009543 | 96.399 | 28386593.97 | $2.84 \times 10^7$ | $8.21 \times 10^{-6}$ |
| 2 | $2.85 \times 10^7$ | $2.79 \times 10^7$ | 0.010256 | 103.596 | 28379146.12 | $2.84 \times 10^7$ | $4.41 \times 10^{-4}$ |
| 3 | $2.87 \times 10^7$ | $2.79 \times 10^7$ | 0 | 0 | 28372006.39 | $2.84 \times 10^7$ | $8.01 \times 10^{-4}$ |
| 4 | $2.84 \times 10^7$ | $2.79 \times 10^7$ | 0 | 0 | 28365444.69 | $2.83 \times 10^7$ | $2.16 \times 10^{-e}$ |
| 5 | $1.49 \times 10^7$ | $2.79 \times 10^7$ | 0 | 0 | 28372006.39 | $2.83 \times 10^7$ | $3.58 \times 10^{-6}$ |
| 6 | $7.17 \times 10^6$ | $2.79 \times 10^7$ | 0 | 0 | 27210672.49 | | 0.0128 |

Figure 13:
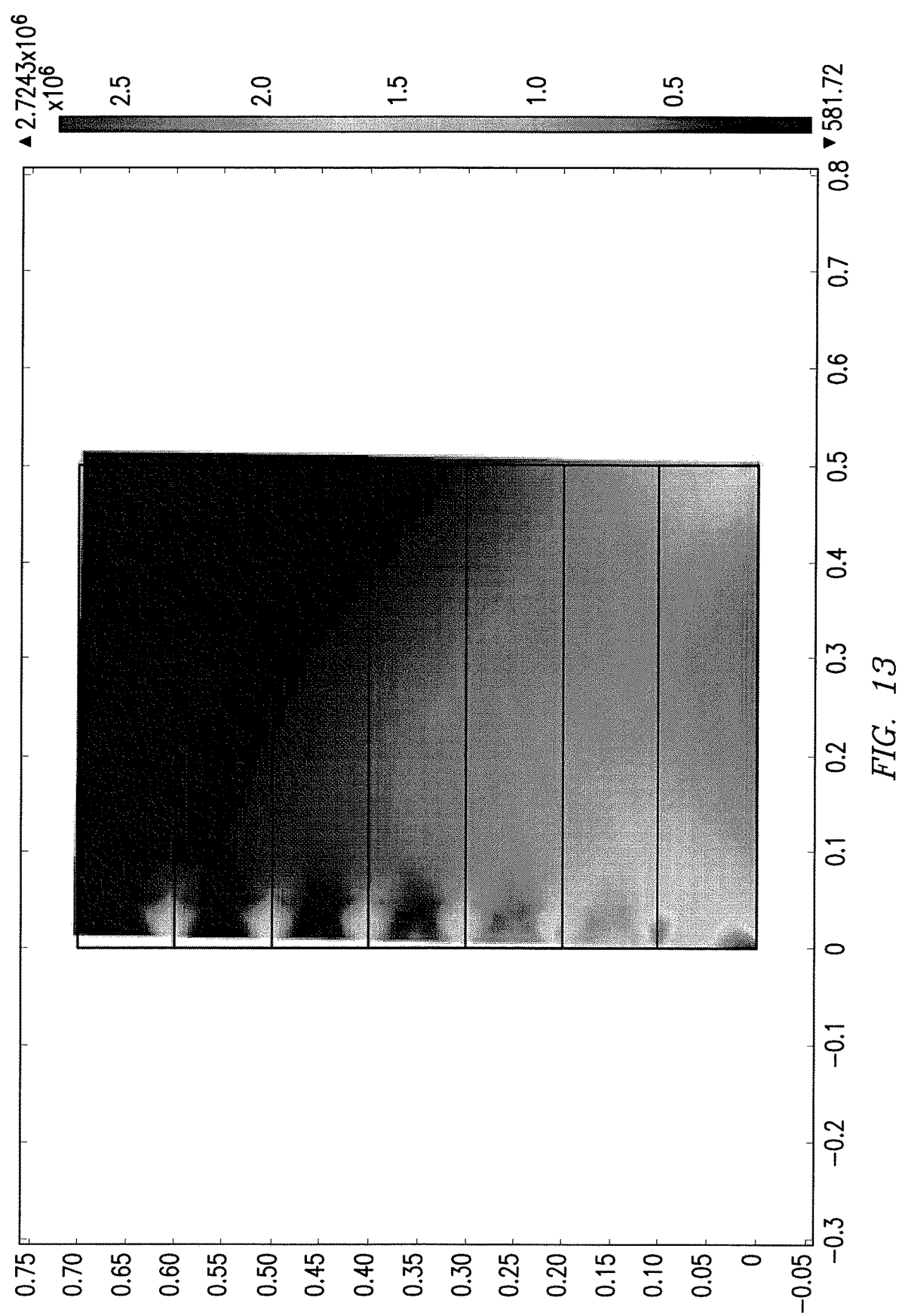
FIG. 13 is a plot illustrating an example formation stress field according to certain embodiments of the present disclosure.

The well pressure calculated using the integrated diversion model was used to compute the stress field in the rock to obtain the formation stress field shown in FIG. 13. FIG. 13 depicts stress shadowing for the six perforation clusters with the diverter.

Example 2

According to aspects of the present disclosure, an example diversion flow model was generated for an example perforated wellbore-fracture system consisting of a vertical wellbore and horizontal fractures. The wellbore was assumed to have a diameter of 0.1 m and a length of 1000 m. The reservoir formation was assumed to have three fractures, a pay zone height of 500 m, an effective length of 100 m, and a permeability of $1 \times 10^{-5}$ m. The example fluid had a viscosity of $1 \times 10^{-3}$ Pa·s and a density of $1 \times 10^3$ kg/m³. The fluid was injected with a velocity of 10 m/s. The diverter in this example was polylactic acid (PLA), and was present in a concentration of 460 kg/m³. With a grid size of 1 m for both the wellbore and the reservoir and a time step of 0.1 s, the velocity distributions shown in FIGS. 14 and 15 were calculated using the diversion flow model.

Figure 14:
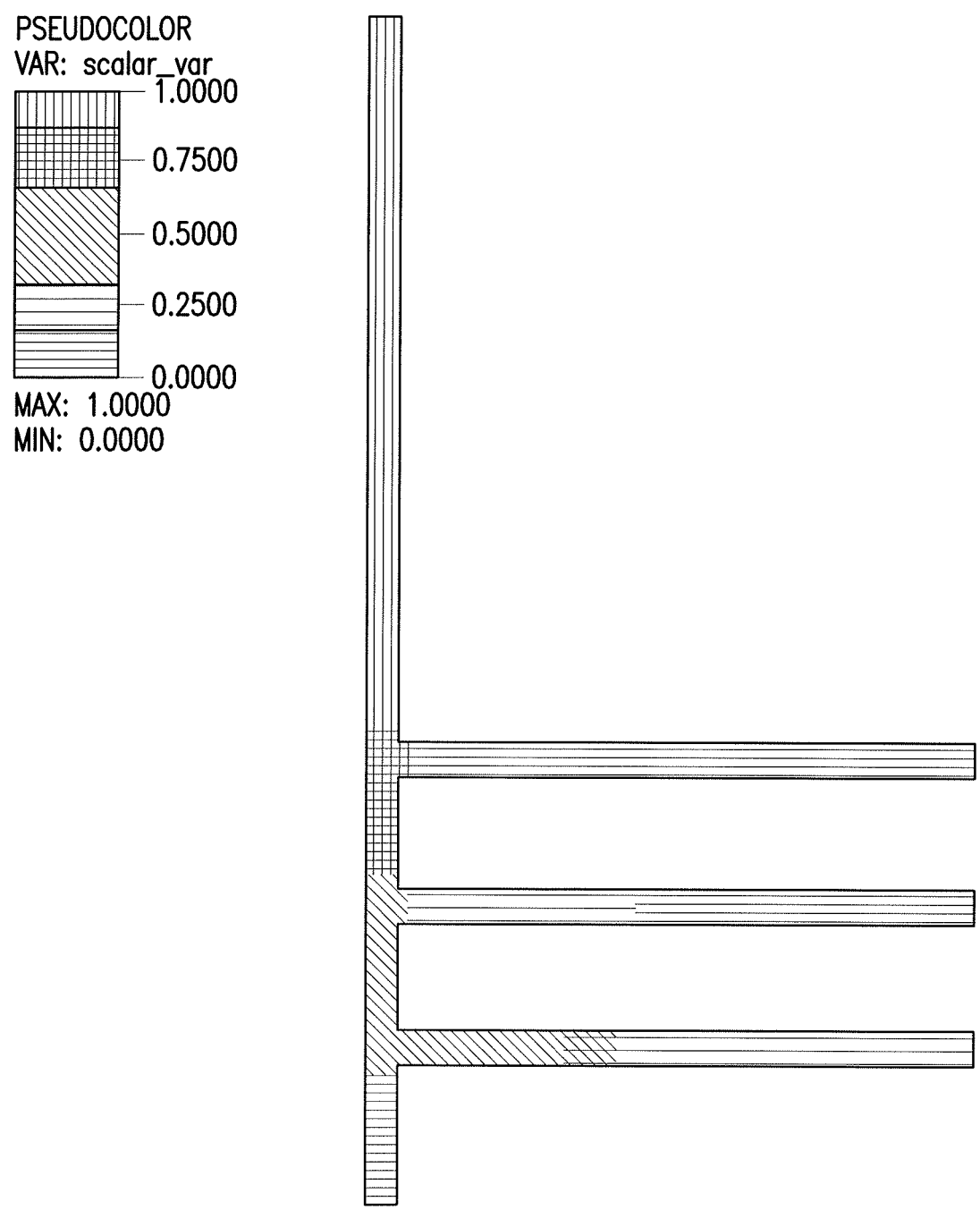
FIG. 14 is a plot illustrating an example velocity distribution in a wellbore system prior to the introduction of a diverter according to certain embodiments of the present disclosure.
Figure 15:
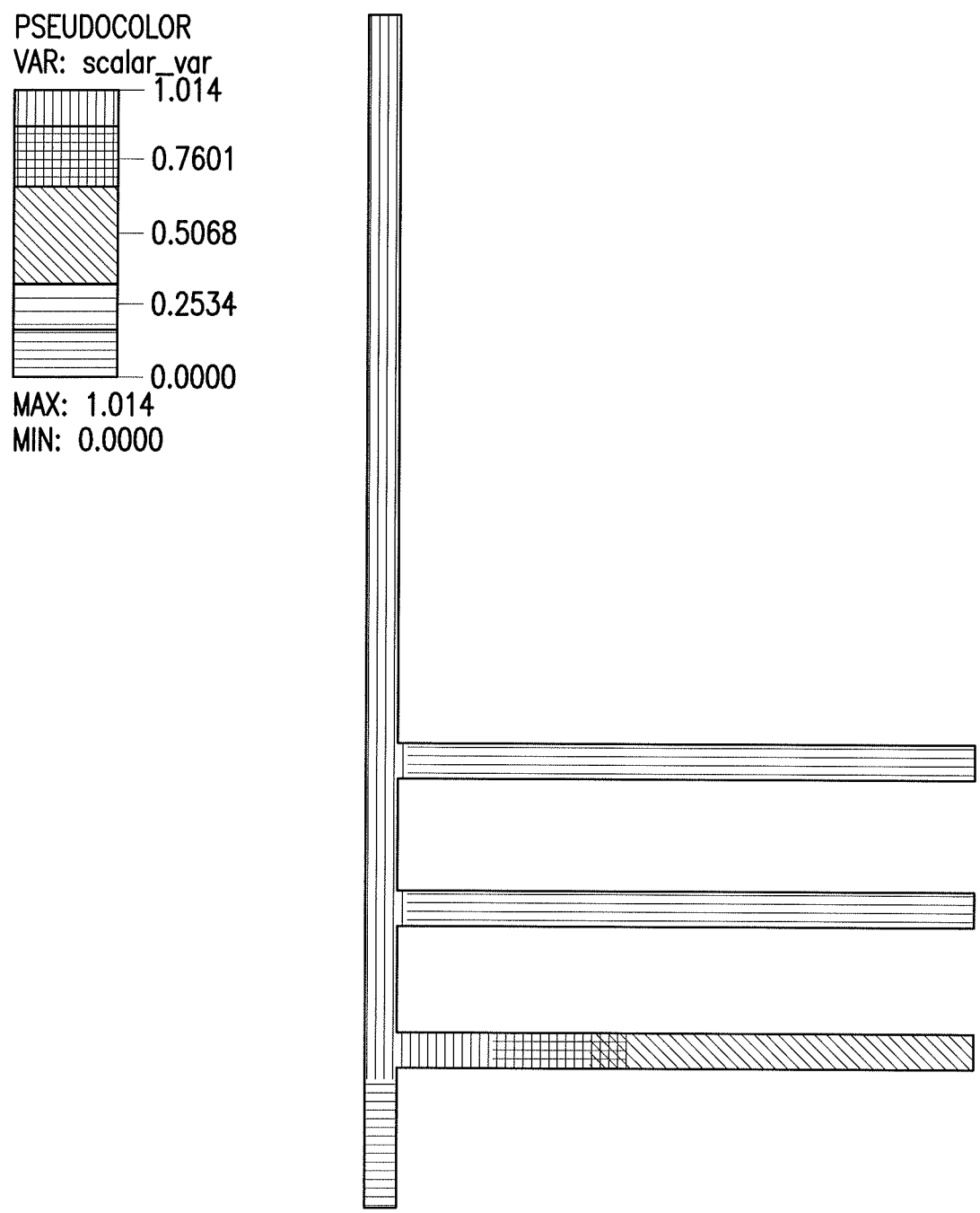
FIG. 15 is a plot illustrating an example velocity distribution in a wellbore system after the introduction of a diverter according to certain embodiments of the present disclosure.
Figure 16:
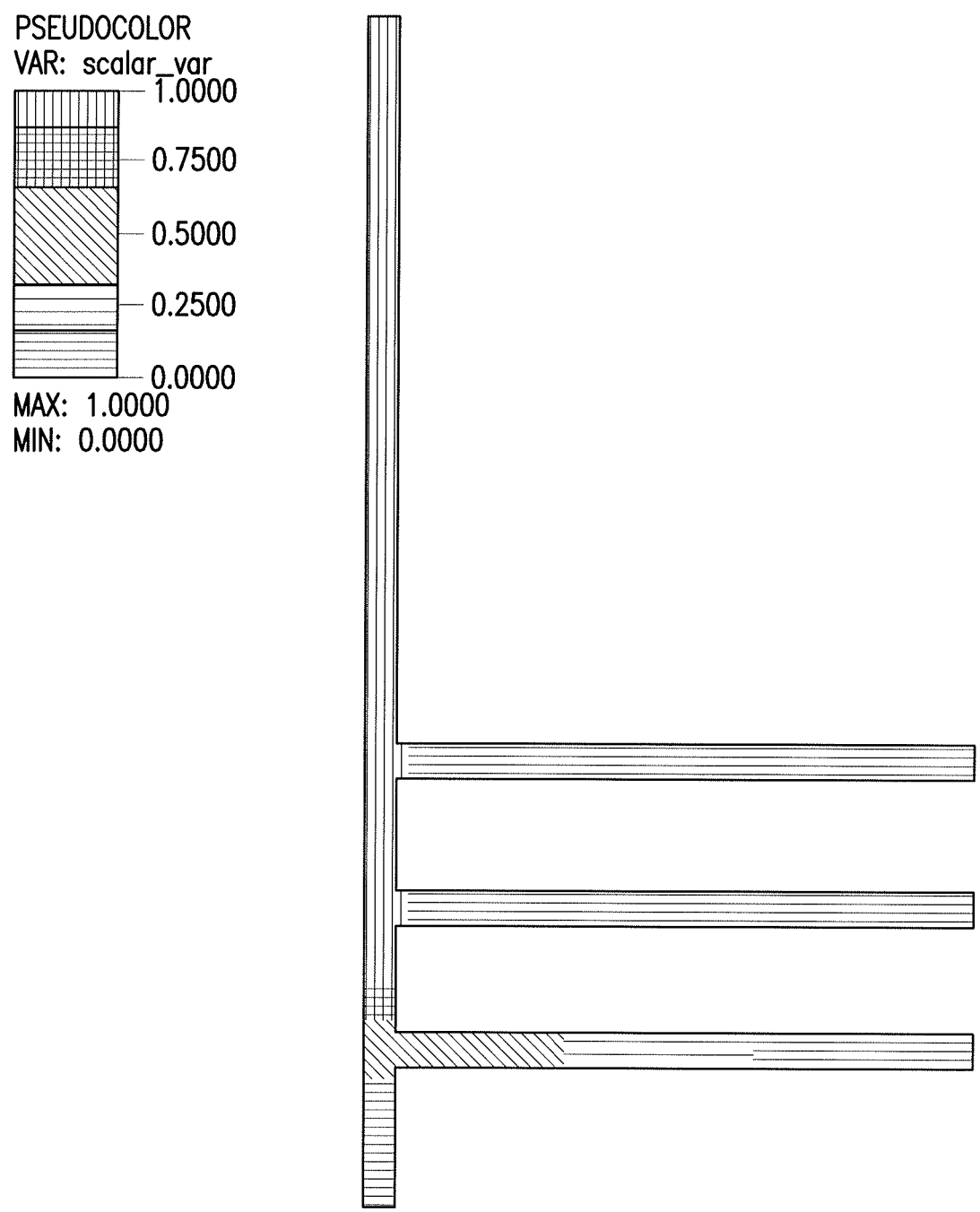
FIG. 16 is a plot illustrating an example diverter concentration distribution in a wellbore system after the introduction of a diverter according to certain embodiments of the present disclosure.

FIG. 14 shows the velocity distribution at time=0.43 s, before the diverter was introduced. FIG. 15 shows the velocity distribution later in time, after the diverter was introduced. As shown in FIG. 15, the diverter has entered each layer, and has just entered the last perforation cluster. FIG. 15 shows that quick diversion to low permeability layers may be obtained by using PLA as a diverter. FIG. 16 shows the concentration of the diverter in the reservoir layers as a function of distance. The diverter is assumed to be in the near wellbore region (in the perforations and within one grid element inside the fracture) for all of the fractures except for the last fracture, where the remaining diverter flows out. FIG. 16 shows that the diverter is effective in diverting the fluid. The PLA diverter has reduced the flow by reducing the permeability, as described by equation (6).

Example 3

An example acidizing diversion model was generated for a wellbore system according to certain embodiments of the present disclosure. In this example, static fluid loss tests were performed in slots to determine the permeability of a diverter cake comprising PLA and BC. Permeability was computed using Darcy's law and flow loss. The initial permeability of the slot was calculated as $$K = \frac{W^2}{12}.$$

Multiple regression analysis based on equation (37) was performed on lab data and resulted in constants of A=25311.4, a=0.895, b=6.058, and c=2.004. The $R^2$ value was 0.964 with 24 observations.

Acidizing software was used to determine the diversion. The perforation was assumed to be blocking the flow. The pumping schedule consisted of 6 stages with the third stage defined as the diverter stage. Thus, W was replaced with $2r_{perf}$ and the initial permeability of the perforation (assuming the perforation to be a cylinder) using the lubrication approximation is $r_{perf}^2/8$. This can be derived as follows: The velocity in a cylinder assuming negligible pressure gradients in the r-direction and axisymmetric is:

$$u = \frac{1}{4\mu} \frac{\partial P}{\partial z}(r^2 - R^2) \tag{51}$$

The average velocity over the cross section is:

$$\bar{u} = \frac{1}{8\mu} \frac{\partial \bar{P}}{\partial z}(-r_{perf}^2) \tag{52}$$

Figure 17:
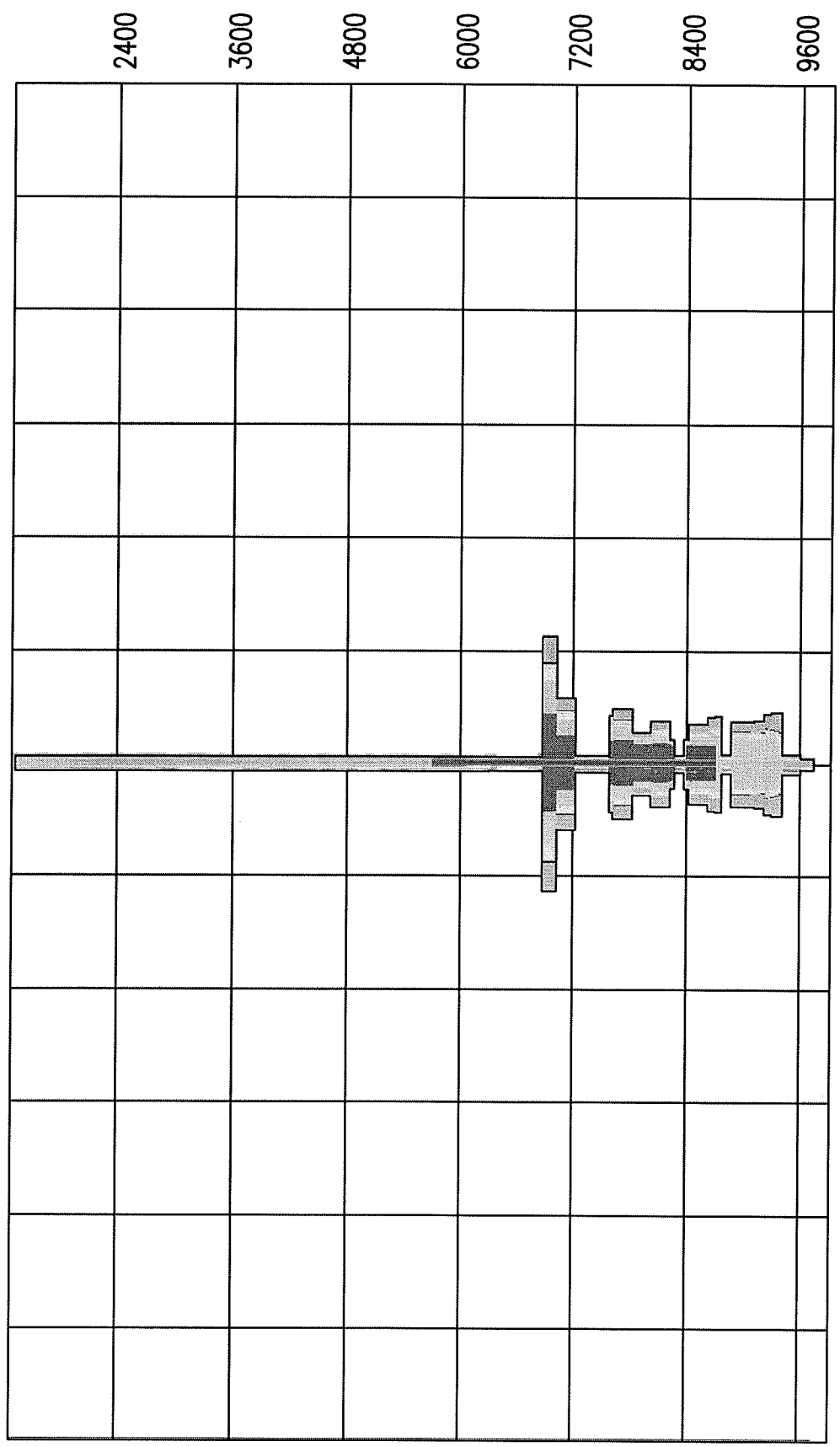
FIG. 17 is a simulation illustrating an example fluid distribution prior to introducing a diverter according to certain embodiments of the present disclosure.
Figure 18:
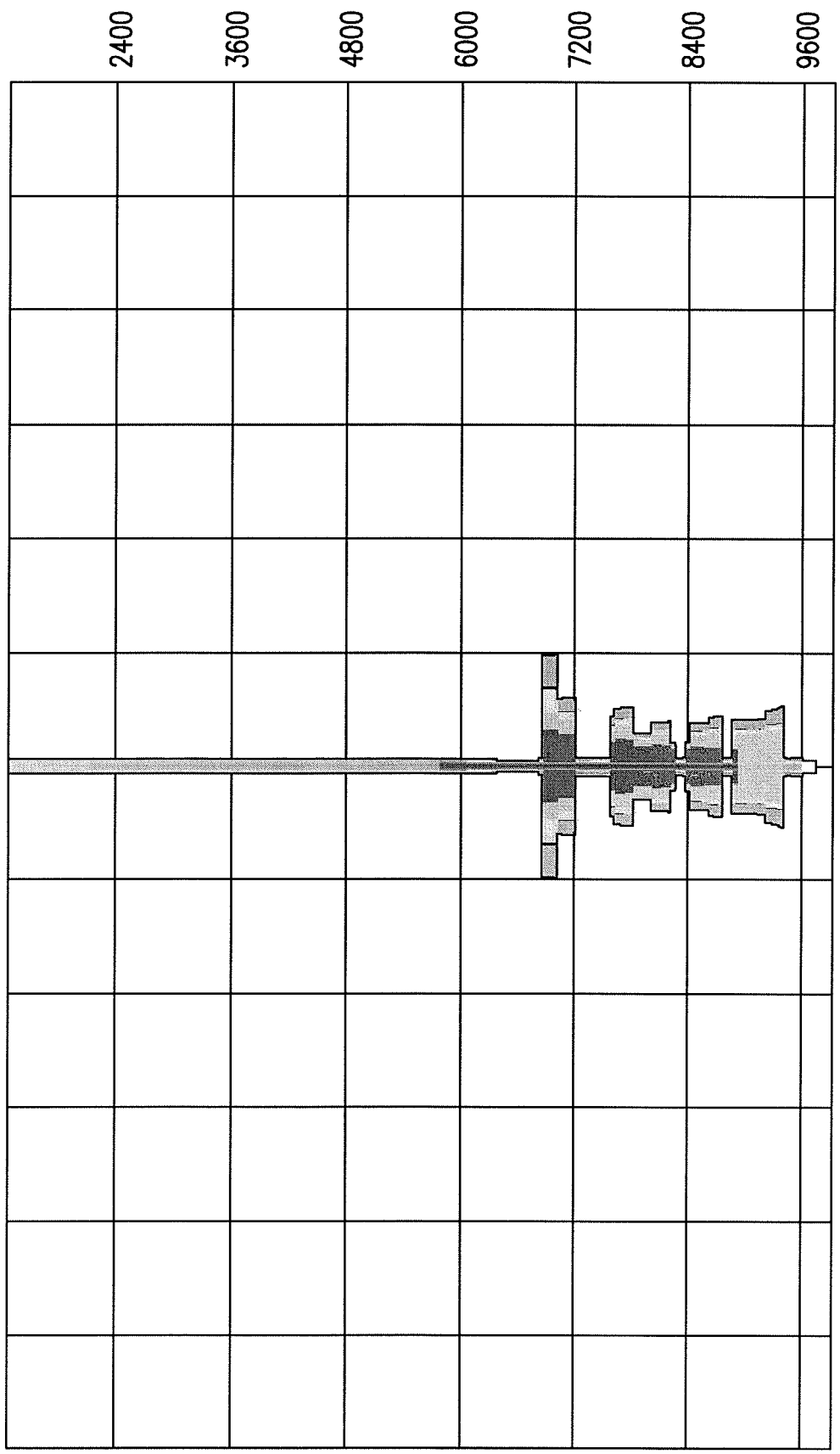
FIG. 18 is a simulation illustrating an example fluid distribution after introducing a diverter according to certain embodiments of the present disclosure.

FIGS. 17 and 18 depict the fluid distributions calculated by the software implementing the acidizing diversion model. FIG. 17 depicts the acidizing fluid distribution calculated by the software with no diverter. FIG. 18 depicts the acidizing fluid distribution calculated by the software with the diverter. FIGS. 17 and 18 show that the non-diverted acidizing fluid distribution is non-uniform, whereas the diverter treatment provides a more uniform acidizing fluid distribution.

According to aspects of the present disclosure, an example method: receiving, at a processing component, one or more wellbore treatment inputs characterizing a treatment operation for a wellbore penetrating at least a portion of a subterranean formation, wherein the treatment operation comprises a treatment fluid comprising a diverter; receiving, at the processing component, one or more formation inputs characterizing the subterranean formation; using the processing component to determine a wellbore pressure distribution based, at least in part, on the one or more wellbore treatment inputs and a wellbore model, wherein the wellbore model comprises: a fluid flow model, a diverter transport model, and a junction model; and using the processing component to determine a formation stress field for the subterranean formation, based, at least in part, on the one or more formation inputs, the wellbore pressure distribution, and a geomechanical model of the subterranean formation.

In one or more embodiments described in the preceding paragraph, the method further comprises: determining a wellbore flow distribution based, at least in part, on the one or more wellbore treatment inputs and the wellbore model, wherein the wellbore pressure distribution is determined based, at least in part, on the wellbore flow distribution.

In one or more embodiments described in the preceding two paragraphs, at least one of the one or more wellbore treatment inputs comprises real-time measurements from one or more wellsite data sources.

In one or more embodiments described in the preceding paragraph, the real-time measurements comprise at least one of pressure measurements obtained from pressure sensors at a surface of the wellbore and flow rate measurements.

In one or more embodiments described in the preceding four paragraphs, the geomechanical model comprises the following equation:

$$Kx=F$$

where K is the stiffness matrix, x is the displacements vector and F is the force vector.

In one or more embodiments described in the preceding five paragraphs, the fluid flow model comprises a one-dimensional fluid flow model.

In one or more embodiments described in the preceding six paragraphs, the fluid flow model comprises the following equations:

$$p_x - \rho g + f = 0$$

$$Q - Q_L = 0$$

where p represents the pressure along the wellbore, x is the wellbore alignment direction, $\rho$ is the fluid-proppant mixture density, g is gravitational acceleration, f is the friction force, Q is the wellbore flow rate, and $Q_L$ is the leak-off flow rate into the formation through the perforations.

In one or more embodiments described in the preceding seven paragraphs, the diverter transport model comprises the following equation:

$$(\phi Q)_x = 0$$

where $\phi$ is the diverter volume fraction, Q is the flow rate in the wellbore, and the x subscript denotes the partial derivative with respect to the wellbore alignment direction.

In one or more embodiments described in the preceding eight paragraphs, the junction model comprises the following equation:

$$M_j = \frac{Q_j}{Q_{Total}} M_{Total}$$

where $M_j$ is the fraction of the diverter in each section of interest, $M_{Total}$ is the total mass of the diverter, $Q_j$ is the flow rate in each section of interest, and $Q_{Total}$ is the total flow rate for the system.

In one or more embodiments described in the preceding nine paragraphs, the method further comprises: performing the treatment operation based, at least in part, on the formation stress field.

In one or more embodiments described in the preceding ten paragraphs, at least one of the one or more wellbore treatment inputs is selected from the group consisting of: an amount of diverter pumped into the wellbore system, the wellbore pressure at the injection points, a flow rate at the wellbore inlet, a pressure at the wellbore inlet, a wellbore depth, a wellbore diameter, a number of perforation clusters, a perforation cluster length, a perforation diameter, a distance between perforation clusters, a diverter particle diameter, and any combination thereof.

In one or more embodiments described in the preceding eleven paragraphs, at least one of the one or more wellbore treatment inputs is an amount of diverter introduced into the wellbore system.

In one or more embodiments described in the preceding twelve paragraphs, the method further comprises: displaying a simulation representative of the formation stress field on a display coupled to the processing component.

In one or more embodiments described in the preceding thirteen paragraphs, the method further comprises: performing the treatment operation based, at least in part, on the formation stress field; monitoring the treatment operation; and adjusting the treatment operation based on the monitoring.

In one or more embodiments described in the preceding paragraph, the monitoring comprises determining the formation stress field at one or more time steps during the treatment operation.

According to aspects of the present disclosure, an example method comprises: receiving, at a processing component, one or more treatment operation inputs characterizing a treatment operation for a wellbore system comprising a wellbore penetrating at least a portion of a subterranean formation and a treatment fluid comprising a diverter, wherein at least one of the one or more treatment operation inputs comprises the inlet concentration of the diverter in the treatment fluid; and using the processing component to determine a wellbore system pressure distribution and a wellbore system flow distribution based, at least in part, on the one or more treatment operation inputs and a diversion flow model, wherein the diversion flow model captures an effect of the diverter on fluid flow in the wellbore system.

In one or more embodiments described in the preceding paragraph, the diversion flow model captures the effect of the diverter on fluid flow by accounting for the reduction in permeability caused by the diverter based, at least in part, on the following equation:

$$u_f = -\frac{1}{\frac{\mu \log(R_w + \delta)/R_w}{k 2\pi L_{perf}} + \frac{\mu \Delta R}{kwh}} \frac{\partial p}{\partial y}$$

where $u_f$ is the fluid velocity, $\delta$ is the additional resistance to flow caused by the diverter, $L_{perf}$ is the length of the perforation, $\Delta R$ is the change in fracture radius, $R_w$ is the flow resistance, p is fluid pressure, y is the position along the fracture, $\mu$ is fluid viscosity, w is the fracture width, h is the fracture high, and k is permeability.

In one or more embodiments described in the preceding two paragraphs, at least one of the one or more treatment operation inputs is selected from the group consisting of: an inlet concentration of the diverter in the treatment fluid, a treatment fluid flow rate, a treatment fluid viscosity, a treatment fluid density, the dimensions of the wellbore, completion information, a property of the subterranean formation, and any combination thereof.

In one or more embodiments described in the preceding three paragraphs, the method further comprises: performing the treatment operation based, at least in part, on at least one of the wellbore system pressure distribution and the wellbore system flow distribution.

According to aspects of the present disclosure, an example method comprises: selecting a diverter and a bridging agent for use in an acidizing operation for a wellbore system; using the processing component to generate a permeability reduction model for the diverter and the bridging agent; using the processing component to generate an acidizing diversion model for the wellbore system comprising the diverter and the bridging agent, wherein the acidizing diversion model comprises the permeability reduction model; receiving, at the processing component, one or more parameters related to the acidizing operation; and using the processing component to simulate the acidizing operation based, at least in part, on applying the acidizing diversion model to the one or more parameters related to the acidizing operation.

In one or more embodiments described in the preceding paragraph, generating the permeability reduction model comprises fitting experimental permeability data to the following equation:

$$\frac{K_{D+BA}}{K} = \frac{1}{1 + A\left(\frac{u_f t}{\rho_f D_p^2}\right)^a \left(\frac{w}{D_p}\right)^b \left(\frac{\rho_f}{C_{D+BA}}\right)^c \left(\frac{M_{BA}}{M_D}\right)^d}$$

where $K_{D+BA}$ is the permeability of the diverter and bridging agent, K is permeability, $u_f$ is fluid velocity, $D_p$ is the average diameter of the particle, $\rho_f$ is the density of the fluid, $C_{D+BA}$ is the volume concentration of the diverter and bridging agent, μ is the viscosity of the fluid, w is the width of the fracture, $M_{BA}$ is the mass ratio of the bridging agent, $M_D$ is the mass ratio of the diverter, t is time, and a, b, c, d, and A are fit constants.

In one or more embodiments described in the preceding two paragraphs, generating the acidizing diversion model comprises: determining a skin for the wellbore system based, at least in part, on a diverter cake thickness.

In one or more embodiments described in the preceding paragraph, determining the skin for the wellbore system comprises: calculating an increase in diverter cake volume for a perforation in the wellbore system based, at least in part, on the diverter cake thickness; determining whether the area of the perforation is blocked by a diverter cake; if the area of the perforation is blocked by the diverter cake, recalculating the increase in cake volume based, at least in part, on the diverter cake length; and determining whether the entire length of the perforation is blocked by the diverter cake.

In one or more embodiments described in the preceding four paragraphs, the method further comprises: performing the acidizing operation for the wellbore system.

In one or more embodiments described in the preceding five paragraphs, the method further comprises: displaying the simulated acidizing operation on a display coupled to the processing component.

According to aspects of the present disclosure, an example system comprises: at least one processor; and a memory coupled to the processor having instructions stored therein, which when executed by the process, cause the processor to perform functions, including functions to: receive one or more wellbore treatment inputs characterizing a treatment operation for a wellbore penetrating at least a portion of a subterranean formation, wherein the treatment operation comprises a treatment fluid comprising a diverter; receive one or more formation inputs characterizing the subterranean formation; determine a wellbore pressure distribution based, at least in part, on the one or more wellbore treatment inputs and a wellbore model, wherein the wellbore model comprises: a fluid flow model, a diverter transport model, and a junction model; and determine a formation stress field for the subterranean formation, based, at least in part, on the one or more formation inputs, the wellbore pressure distribution, and a geomechanical model of the subterranean formation.

According to aspects of the present disclosure, an example system comprises: at least one processor; and a memory coupled to the processor having instructions stored therein, which when executed by the process, cause the processor to perform functions, including functions to: receive one or more treatment operation inputs characterizing a treatment operation for a wellbore system comprising a wellbore penetrating at least a portion of a subterranean formation and a treatment fluid comprising a diverter, wherein at least one of the one or more treatment operation inputs comprises the inlet concentration of the diverter in the treatment fluid; and determine a wellbore system pressure distribution and a wellbore system flow distribution based, at least in part, on the one or more treatment operation inputs and a diversion flow model, wherein the diversion flow model captures an effect of the diverter on fluid flow in the wellbore system.

According to aspects of the present disclosure, an example system comprises: at least one processor; and a memory coupled to the processor having instructions stored therein, which when executed by the process, cause the processor to perform functions, including functions to: select a diverter and a bridging agent for use in an acidizing operation for a wellbore system; generate a permeability reduction model for the diverter and the bridging agent; generate an acidizing diversion model for the wellbore system comprising the diverter and the bridging agent, wherein the acidizing diversion model comprises the permeability reduction model; receive one or more parameters related to the acidizing operation; and simulate the acidizing operation based, at least in part, on applying the acidizing diversion model to the one or more parameters related to the acidizing operation.

According to aspects of the present disclosure, an example computer-implemented medium comprises: a computer-readable storage medium having instructions stored therein, which when executed by a computer cause the computer to perform functions, including functions to: receive one or more wellbore treatment inputs characterizing a treatment operation for a wellbore penetrating at least a portion of a subterranean formation, wherein the treatment operation comprises a treatment fluid comprising a diverter; receive one or more formation inputs characterizing the subterranean formation; determine a wellbore pressure distribution based, at least in part, on the one or more wellbore treatment inputs and a wellbore model, wherein the wellbore model comprises: a fluid flow model, a diverter transport model, and a junction model; and determine a formation stress field for the subterranean formation, based, at least in part, on the one or more formation inputs, the wellbore pressure distribution, and a geomechanical model of the subterranean formation.

According to aspects of the present disclosure, an example computer-implemented medium comprises: a computer-readable storage medium having instructions stored therein, which when executed by a computer cause the computer to perform functions, including functions to: receive one or more wellbore treatment inputs characterizing a treatment operation for a wellbore penetrating at least a portion of a subterranean formation, wherein the treatment operation comprises a treatment fluid comprising a diverter; receive one or more formation inputs characterizing the subterranean formation; determine a wellbore pressure distribution based, at least in part, on the one or more wellbore treatment inputs and a wellbore model, wherein the wellbore model comprises: a fluid flow model, a diverter transport model, and a junction model; and determine a formation stress field for the subterranean formation, based, at least in part, on the one or more formation inputs, the wellbore pressure distribution, and a geomechanical model of the subterranean formation.

According to aspects of the present disclosure, an example computer-implemented medium comprises: a computer-readable storage medium having instructions stored therein, which when executed by a computer cause the computer to perform functions, including functions to: select a diverter and a bridging agent for use in an acidizing operation for a wellbore system; generate a permeability reduction model for the diverter and the bridging agent; generate an acidizing diversion model for the wellbore system comprising the diverter and the bridging agent, wherein the acidizing diversion model comprises the permeability reduction model; receive one or more parameters related to the acidizing operation; and simulate the acidizing operation based, at least in part, on applying the acidizing diversion model to the one or more parameters related to the acidizing operation.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. While numerous changes may be made by those skilled in the art, such changes are encompassed within the spirit of the subject matter defined by the appended claims. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. In particular, every range of values (e.g., "from about a to about b," or, equivalently, "from approximately a to b," or, equivalently, "from approximately a-b") disclosed herein is to be understood as referring to the power set (the set of all subsets) of the respective range of values. The terms in the claims have their plain, ordinary meaning unless otherwise explicitly and clearly defined by the patentee.

What is claimed is:

1. A method comprising:
receiving, at a processing component, one or more wellbore treatment inputs characterizing a treatment operation for a wellbore penetrating at least a portion of a subterranean formation, wherein the treatment operation comprises a treatment fluid comprising a diverter;
receiving, at the processing component, one or more formation inputs characterizing the subterranean formation;
using the processing component to determine a wellbore pressure distribution based, at least in part, on the one or more wellbore treatment inputs and a wellbore model, wherein the wellbore model comprises:
a fluid flow model,
a diverter transport model, and
a junction model; and
using the processing component to determine a formation stress field for the subterranean formation, based, at least in part, on the one or more formation inputs, the wellbore pressure distribution, and a geomechanical model of the subterranean formation.

2. The method of claim 1, further comprising:
determining a wellbore flow distribution based, at least in part, on the one or more wellbore treatment inputs and the wellbore model, wherein the wellbore pressure distribution is determined based, at least in part, on the wellbore flow distribution.

3. The method of claim 1, wherein at least one of the one or more wellbore treatment inputs comprises real-time measurements from one or more wellsite data sources.

4. The method of claim 1, wherein the fluid flow model comprises a one-dimensional fluid flow model.

5. The method of claim 1, wherein the fluid flow model comprises the following equations:

$$p_x - \rho g + f = 0$$

$$Q - Q_L = 0$$

where p represents the pressure along the wellbore, x is the wellbore alignment direction, $\rho$ is the fluid-proppant mixture density, g is gravitational acceleration, f is the friction force, Q is the wellbore flow rate, and $Q_L$ is the leak-off flow rate into the subterranean formation through the perforations.

6. The method of claim 1, wherein the diverter transport model comprises the following equation:

$$(\phi Q)_x = 0$$

where $\phi$ is the diverter volume fraction, Q is the flow rate in the wellbore, and the x subscript denotes the partial derivative with respect to the wellbore alignment direction.

7. The method of claim 1, wherein the junction model comprises the following equation:

$$M_j = \frac{Q_j}{Q_{Total}} M_{Total}$$

where $M_j$ is the fraction of the diverter in each section of interest, $M_{Total}$ is the total mass of the diverter, $Q_j$ is the flow rate in each section of interest, and $Q_{Total}$ is the total flow rate for the system.

8. The method of claim 1, further comprising:
performing the treatment operation based, at least in part, on the formation stress field.

9. The method of claim 1, further comprising:
displaying a simulation representative of the formation stress field on a display coupled to the processing component.

10. The method of claim 1, further comprising:
performing the treatment operation based, at least in part, on the formation stress field;
monitoring the treatment operation; and
adjusting the treatment operation based on the monitoring.

11. The method of claim 10, wherein the monitoring comprises determining the formation stress field at one or more time steps during the treatment operation.

12. A method comprising:
receiving, at a processing component, one or more treatment operation inputs characterizing a treatment operation for a wellbore system comprising a wellbore penetrating at least a portion of a subterranean formation and a treatment fluid comprising a diverter,
wherein at least one of the one or more treatment operation inputs comprises the inlet concentration of the diverter in the treatment fluid; and
using the processing component to determine a wellbore system pressure distribution and a wellbore system flow distribution based, at least in part, on the one or more treatment operation inputs and a diversion flow model,
wherein the diversion flow model captures an effect of the diverter on fluid flow in the wellbore system.

13. The method of claim 12, wherein the diversion flow model captures the effect of the diverter on fluid flow by accounting for the reduction in permeability caused by the diverter based, at least in part, on the following equation:

$$u_f = -\frac{1}{\frac{\mu \log(R_w + \delta)/R_w}{k 2\pi L_{perf}} + \frac{\mu \Delta R}{kwh}} \frac{\partial p}{\partial y}$$

where $u_f$ is the fluid velocity, $\delta$ is the additional resistance to flow caused by the diverter, $L_{perf}$ is the length of the perforation, $\Delta R$ is the change in fracture radius, $R_w$ is the flow resistance, p is fluid pressure, y is the position along the fracture, $\mu$ is fluid viscosity, w is the fracture width, h is the fracture height, and k is permeability.

14. The method of claim 12, further comprising:
performing the treatment operation based, at least in part, on at least one of the wellbore system pressure distribution and the wellbore system flow distribution.

15. A method comprising:
selecting a diverter and a bridging agent for use in an acidizing operation for a wellbore system;
using a processing component to generate a permeability reduction model for the diverter and the bridging agent;
using the processing component to generate an acidizing diversion model for the wellbore system comprising the diverter and the bridging agent, wherein the acidizing diversion model comprises the permeability reduction model;
receiving, at the processing component, one or more parameters related to the acidizing operation; and
using the processing component to simulate the acidizing operation based, at least in part, on applying the acidizing diversion model to the one or more parameters related to the acidizing operation.

16. The method of claim 15, wherein generating the permeability reduction model comprises fitting experimental permeability data to the following equation:

$$\frac{K_{D+BA}}{K} = \frac{1}{1 + A\left(\frac{u_f t}{\rho_f D_p^2}\right)^a \left(\frac{w}{D_p}\right)^b \left(\frac{\rho_f}{C_{D+BA}}\right)^c \left(\frac{M_{BA}}{M_D}\right)^d}$$

where $K_{D+BA}$ is the permeability of the diverter and bridging agent, K is permeability, $u_f$ is fluid velocity, $D_p$ is the average diameter of the particle, $\rho_f$ is the density of the fluid, $C_{D+BA}$ is the volume concentration of the diverter and bridging agent, $\mu$ is the viscosity of the fluid, w is the width of the fracture, $M_{BA}$ is the mass ratio of the bridging agent, $M_D$ is the mass ratio of the diverter, t is time, and a, b, c, d, and A are fit constants.

17. The method of claim 15, wherein generating the acidizing diversion model comprises:
determining a skin for the wellbore system based, at least in part, on a diverter cake thickness.

18. The method of claim 17, wherein determining the skin for the wellbore system comprises:
calculating an increase in a volume of a diverter cake for a perforation in the wellbore system based, at least in part, on a thickness of the diverter cake;
determining whether the area of the perforation is blocked by the diverter cake;
if the area of the perforation is blocked by the diverter cake, recalculating the increase in cake volume based, at least in part, on a length of the diverter cake; and
determining whether the entire length of the perforation is blocked by the diverter cake.

19. The method of claim 15, further comprising:
performing the acidizing operation for the wellbore system.

20. The method of claim 15, further comprising:
displaying the simulated acidizing operation on a display coupled to the processing component.

* * * * *